(12) United States Patent
Chiu et al.

(10) Patent No.: US 12,148,810 B2
(45) Date of Patent: Nov. 19, 2024

(54) SEMICONDUCTOR DEVICE AND METHOD

(71) Applicant: Taiwan Semiconductor Manufacturing Co., Ltd., Hsinchu (TW)

(72) Inventors: Shih-Hang Chiu, Taichung (TW); Chung-Chiang Wu, Taichung (TW); Jo-Chun Hung, Hsinchu (TW); Wei-Cheng Wang, Hsinchu (TW); Kuan-Ting Liu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/154,087

(22) Filed: Jan. 13, 2023

(65) Prior Publication Data

US 2023/0140968 A1    May 11, 2023

Related U.S. Application Data

(63) Continuation of application No. 17/165,142, filed on Feb. 2, 2021, now Pat. No. 11,594,610.
(Continued)

(51) Int. Cl.
*H01L 29/49* (2006.01)
*H01L 21/02* (2006.01)
(Continued)

(52) U.S. Cl.
CPC .... *H01L 29/4908* (2013.01); *H01L 21/02603* (2013.01); *H01L 21/28088* (2013.01);
(Continued)

(58) Field of Classification Search
CPC .......... H01L 29/4908; H01L 21/02603; H01L 21/28088; H01L 21/823807;
(Continued)

(56) References Cited

U.S. PATENT DOCUMENTS 9,012,319 B1   4/2015   Choi et al.
9,105,694 B2   8/2015   Lee et al.
(Continued)

FOREIGN PATENT DOCUMENTS

KR   20150001449 A   1/2015
KR   20150051147 A   5/2015
(Continued)

*Primary Examiner* — Tong-Ho Kim
(74) *Attorney, Agent, or Firm* — Slater Matsil, LLP

(57) ABSTRACT

Semiconductor devices having improved gate electrode structures and methods of forming the same are disclosed. In an embodiment, a semiconductor device includes a gate structure over a semiconductor substrate, the gate structure including a high-k dielectric layer; an n-type work function layer over the high-k dielectric layer; an anti-reaction layer over the n-type work function layer, the anti-reaction layer including a dielectric material; a p-type work function layer over the anti-reaction layer, the p-type work function layer covering top surfaces of the anti-reaction layer; and a conductive cap layer over the p-type work function layer.

20 Claims, 40 Drawing Sheets

Related U.S. Application Data

(60) Provisional application No. 63/091,969, filed on Oct. 15, 2020.

(51) Int. Cl.
| | |
|---|---|
| *H01L 21/28* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC ............ *H01L 21/823807* (2013.01); *H01L 21/823842* (2013.01); *H01L 21/823864* (2013.01); *H01L 27/092* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC ..... H01L 21/823842; H01L 21/823864; H01L 27/092; H01L 29/0673; H01L 29/42392; H01L 29/66545; H01L 29/66553; H01L 29/66742; H01L 29/78696; H01L 21/28079; H01L 29/42376; H01L 29/7848; H01L 29/66439; H01L 29/6656; H01L 27/0924; H01L 21/823821; H01L 21/823828; H01L 21/823857; B82Y 10/00
USPC ......................................................... 257/351
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,741,720 B1 | 8/2017 | Siddiqui et al. |
| 9,997,519 B1 | 6/2018 | Bao et al. |
| 10,720,431 B1 | 7/2020 | Cheng et al. |
| 10,998,415 B2 | 5/2021 | JangJian et al. |
| 11,380,774 B2 | 7/2022 | Lim et al. |
| 11,430,694 B2 | 8/2022 | Tsai et al. |
| 2015/0004783 A1* | 1/2015 | Lee ................... H01L 29/4236 438/653 |
| 2015/0171218 A1 | 6/2015 | Steigerwald et al. |
| 2016/0126139 A1 | 5/2016 | Yang et al. |
| 2017/0117190 A1 | 4/2017 | Chung et al. |
| 2017/0352559 A1 | 12/2017 | Liu et al. |
| 2018/0315667 A1 | 11/2018 | Kwon et al. |
| 2020/0135471 A1 | 4/2020 | Lin et al. |
| 2020/0144255 A1* | 5/2020 | Lee ................... H01L 29/4966 |
| 2021/0328038 A1* | 10/2021 | Kim ................ H01L 21/823842 |
| 2021/0336033 A1 | 10/2021 | Huang et al. |

FOREIGN PATENT DOCUMENTS

| | | |
|---|---|---|
| KR | 20160129664 A | 11/2016 |
| KR | 20170046347 A | 5/2017 |
| KR | 20180069673 A | 6/2018 |
| KR | 20180121314 A | 11/2018 |

\* cited by examiner

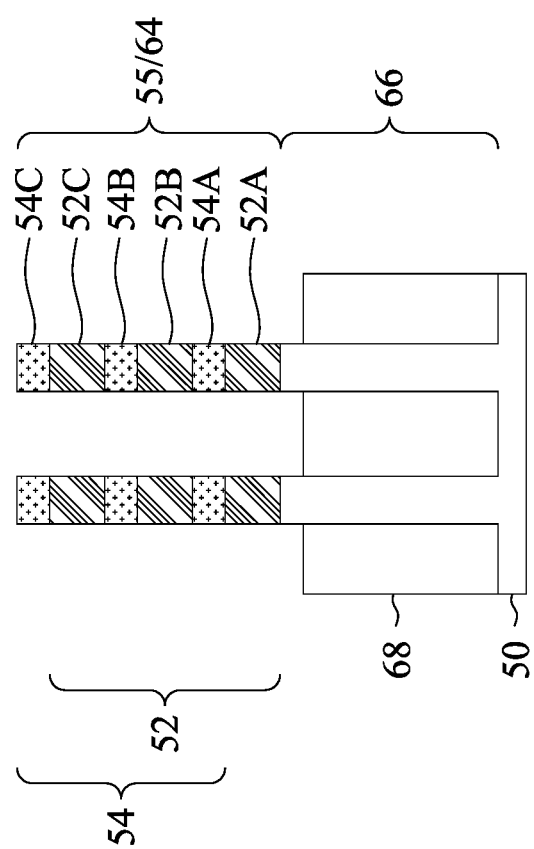

SEMICONDUCTOR DEVICE AND METHOD

PRIORITY CLAIM AND CROSS-REFERENCE

This application is a continuation of U.S. patent application Ser. No. 17/165,142, filed on Feb. 2, 2021, which claims the benefit of U.S. Provisional Application No. 63/091,969, filed on Oct. 15, 2020, entitled "Creative P-Metal Last Scheme for Selective Metal Deposition at N2 Nanosheet for Device Boost," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 11A, 11B, 11C, 12A, 12B, 12C, 12D, 12E, 13A, 13B, 14A, 14B, 15A, 15B, 16A, 16B, 17A, 17B, 18A, 18B, 19A, 19B, 20A, 20B, 20C, 20D, 21A, 21B, 21C, 21D, 22A, 22B, 22C, 22D, 22E, 23A, 23B, 23C, 23D, 23E, 23F, 23G, 23H, 24A, 24B, 25A, 25B, 26A, and 26B are cross-sectional views of intermediate stages in the manufacturing of nano-FETs, in accordance with some embodiments.

DETAILED DESCRIPTION

Figure 1:
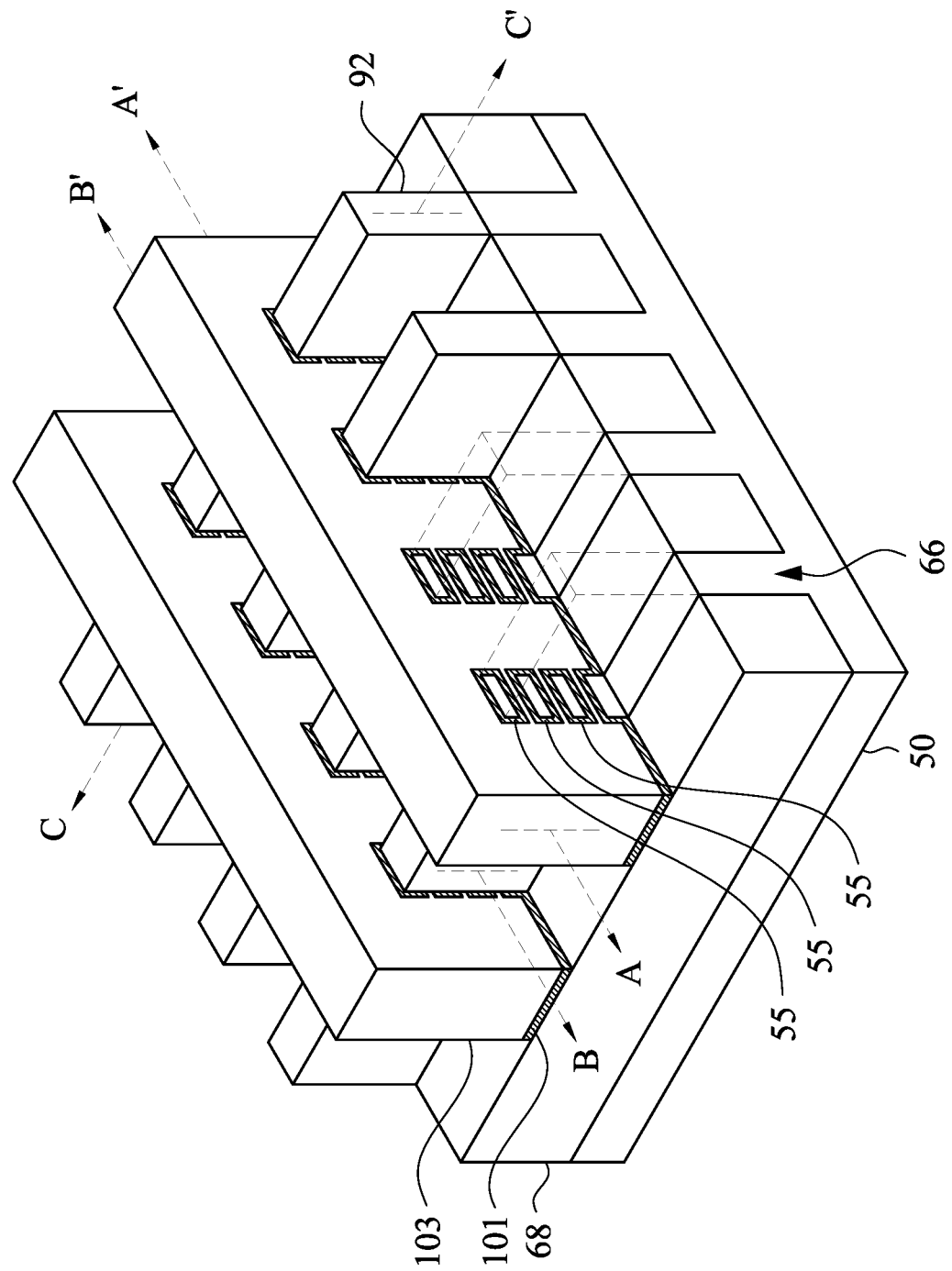
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method for forming improved gate electrodes for semiconductor devices and semiconductor devices formed by said methods. The method includes removing a sacrificial gate stack to form an opening, depositing a gate dielectric layer in the opening, depositing an n-type work function layer over the gate dielectric layer, and depositing an anti-reaction layer over the n-type work function layer. A photoresist material, such as a bottom anti-reflective coating (BARC) material is deposited over the anti-reaction layer, etched back, and used as a mask to etch back the anti-reaction layer and the n-type work function layer. The BARC material is removed and a p-type work function layer is deposited over the n-type work function layer, the anti-reaction layer, and the gate dielectric layer. The p-type work function layer is etched back and a metal cap layer is selectively deposited over the p-type work function layer. The anti-reaction layer may be included in n-type gate electrodes to provide a threshold voltage (Vt) boost. The anti-reaction layer may impede the selective deposition of the metal cap layer. The p-type work function layer is deposited over the anti-reaction layer to allow the metal cap layer to be selectively deposited thereon. The metal cap layer is included to reduce gate resistance. Including the anti-reaction layer and the metal cap layer improve device performance.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 101 extend along top surfaces and side surfaces of the fins 66 and along top surfaces, side surfaces, and bottom surfaces of the nanostructures 55. Gate electrodes 103 are over the gate dielectric layers 101. Epitaxial source/drain regions 92 are disposed on the fins 66 on opposing sides of the gate dielectric layers 101 and the gate electrodes 103.

FIG. 1 further illustrates reference cross-sections that are used in later figures. Cross-section A-A' is along a longitudinal axis of a gate electrode 103 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 26B are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 20C, 21A, 21C, 22A, 22C, 23A, 23C, 24A, 25A, and 26A illustrate reference cross-section A-A' illustrated in FIG. 1. FIGS. 6B, 7B, 8B, 9B, 10B, 11B, 11C, 12B, 12E, 13B, 14B, 15B, 16B, 17B, 18B, 19B, 20B, 20D, 21B, 21D, 22B, 22D, 22E, 23B, 23D, 23E, 23F, 23G, 23H, 24B, 25B, and 26B illustrate reference cross-section B-B' illustrated in FIG. 1. FIGS. 6C, 7C, 8C, 9C, 12C, and 12D illustrate reference cross-section C-C' illustrated in FIG. 1.

Figure 2:
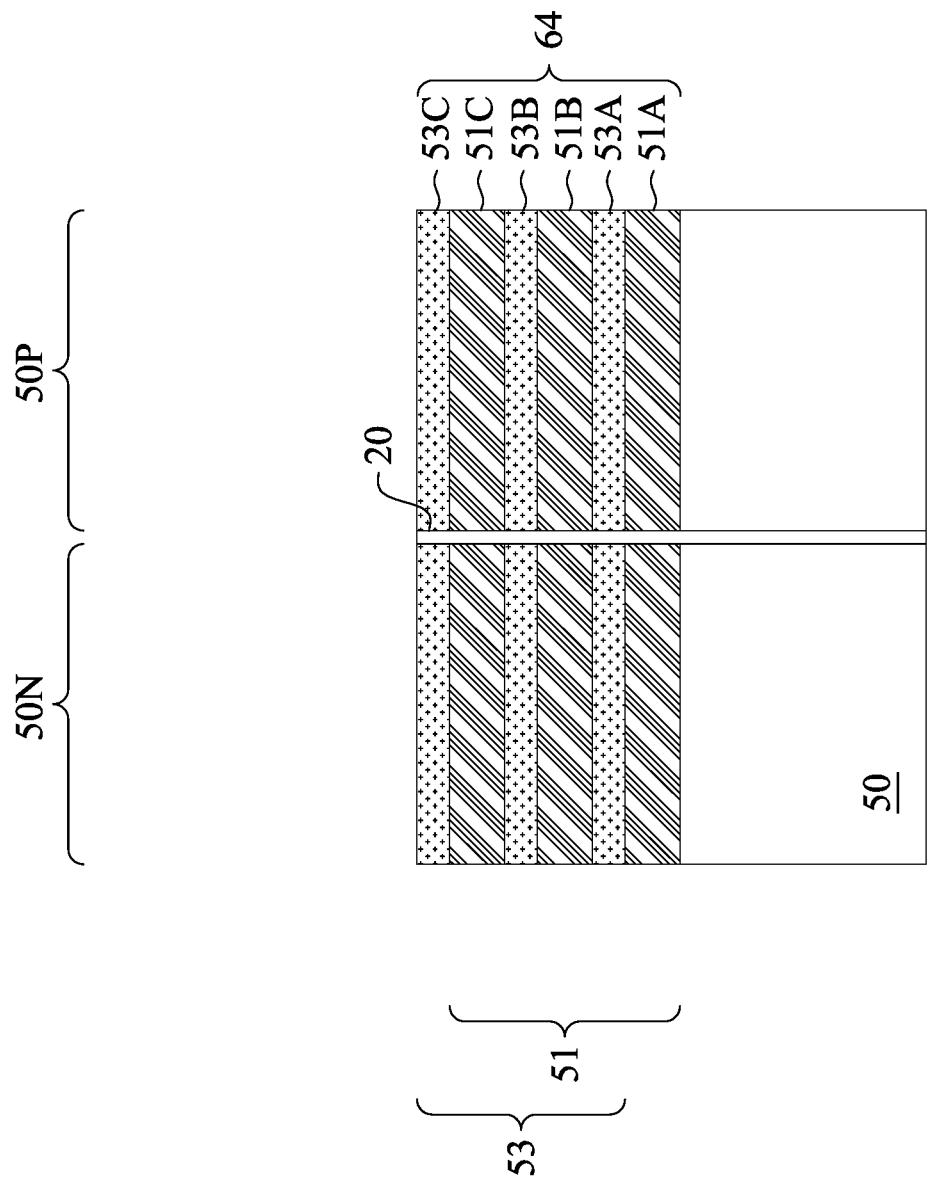

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material, such as silicon germanium or the like, and the second semiconductor layers 53 may be formed of a second semiconductor material, such as silicon, silicon carbon, or the like. The multi-layer stack 64 is illustrated as having a bottommost semiconductor layer formed of the first semiconductor materials for illustrative purposes. In some embodiments, the multi-layer stack 64 may be formed such that the bottommost layer is formed of the second semiconductor materials.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
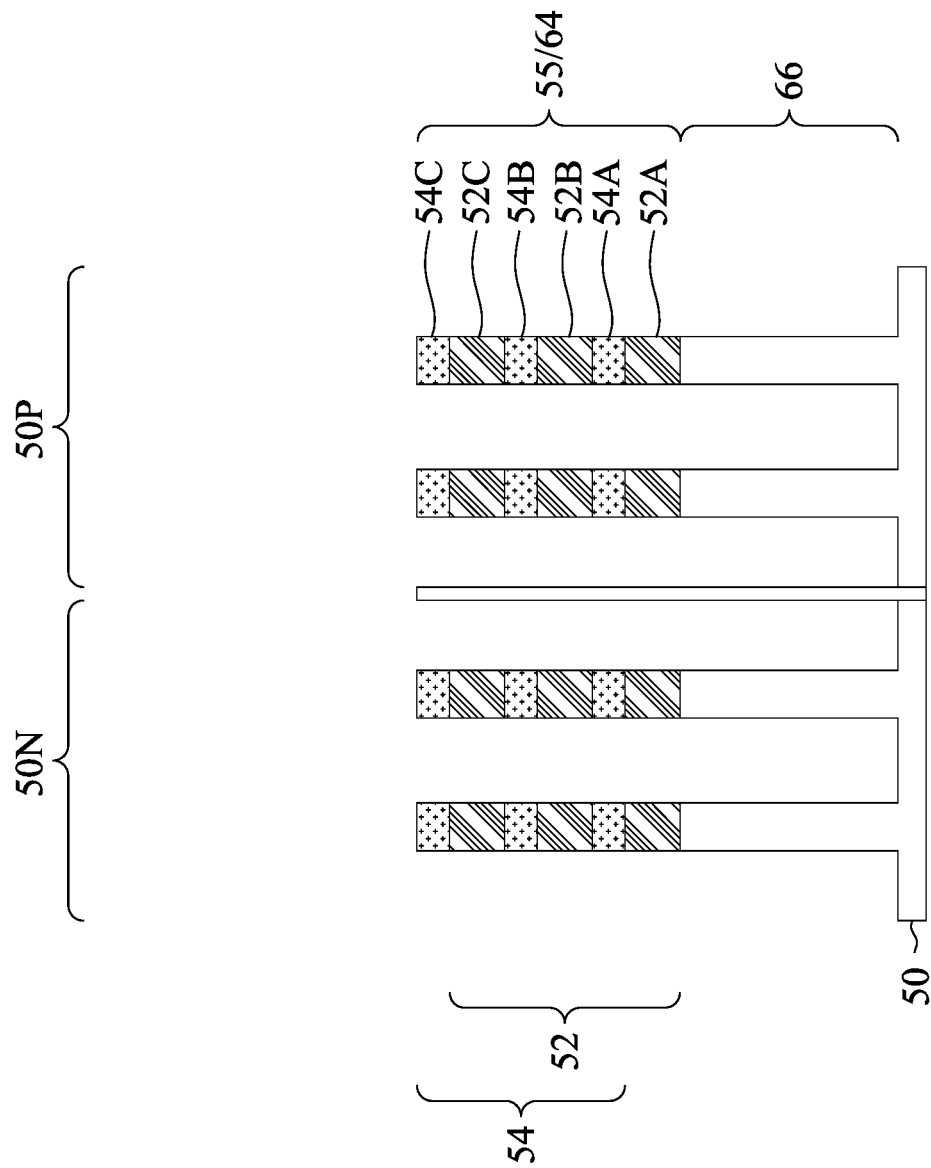

In FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), a neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than widths of the fins 66 in the p-type region 50P. Further, while each of the fins 66 and the nanostructures 55 are illustrated as having consistent widths throughout, in other embodiments, the fins 66 and/or the nanostructures 55 may have tapered sidewalls such that widths of the fins 66 and/or the nanostructures 55 continuously increases in a direction towards the substrate 50. In such embodiments, each of the nanostructures 55 may have different widths and be trapezoidal in shape.

Figure 4:
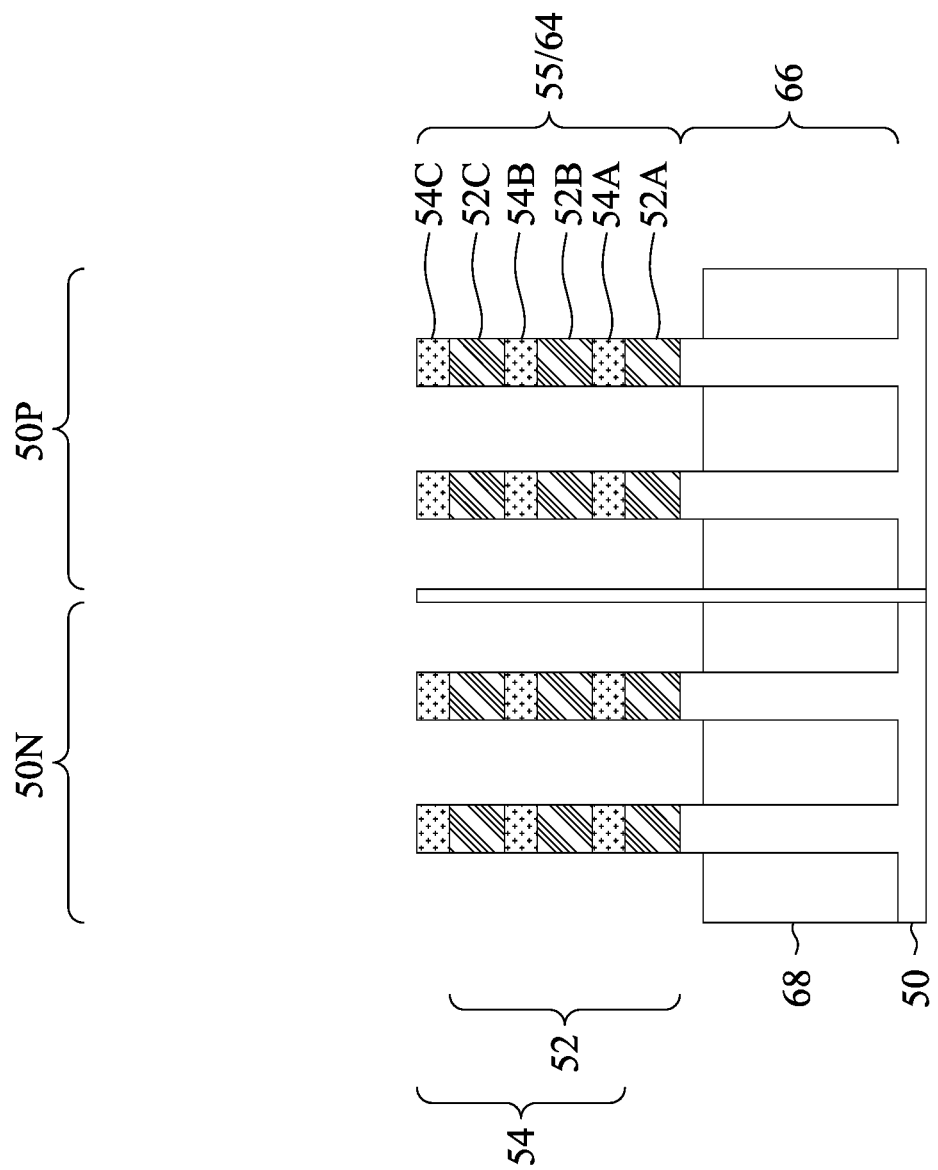

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent ones of the fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along surfaces of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of fins 66 in the n-type region 50N and the p-type region 50P protrude from between neighboring STI regions 68. Further, the top surfaces of the STI regions 68 may have flat surfaces as illustrated, convex surfaces, concave surfaces (such as dishing), or combinations thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric acid (dHF) may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and the resulting first nanostructures 52) and the second semiconductor layers 53 (and the resulting second nanostructures 54) are illustrated and discussed herein as comprising the same materials in the p-type region 50P and the n-type region 50N for illustrative purposes only. In some embodiments, one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
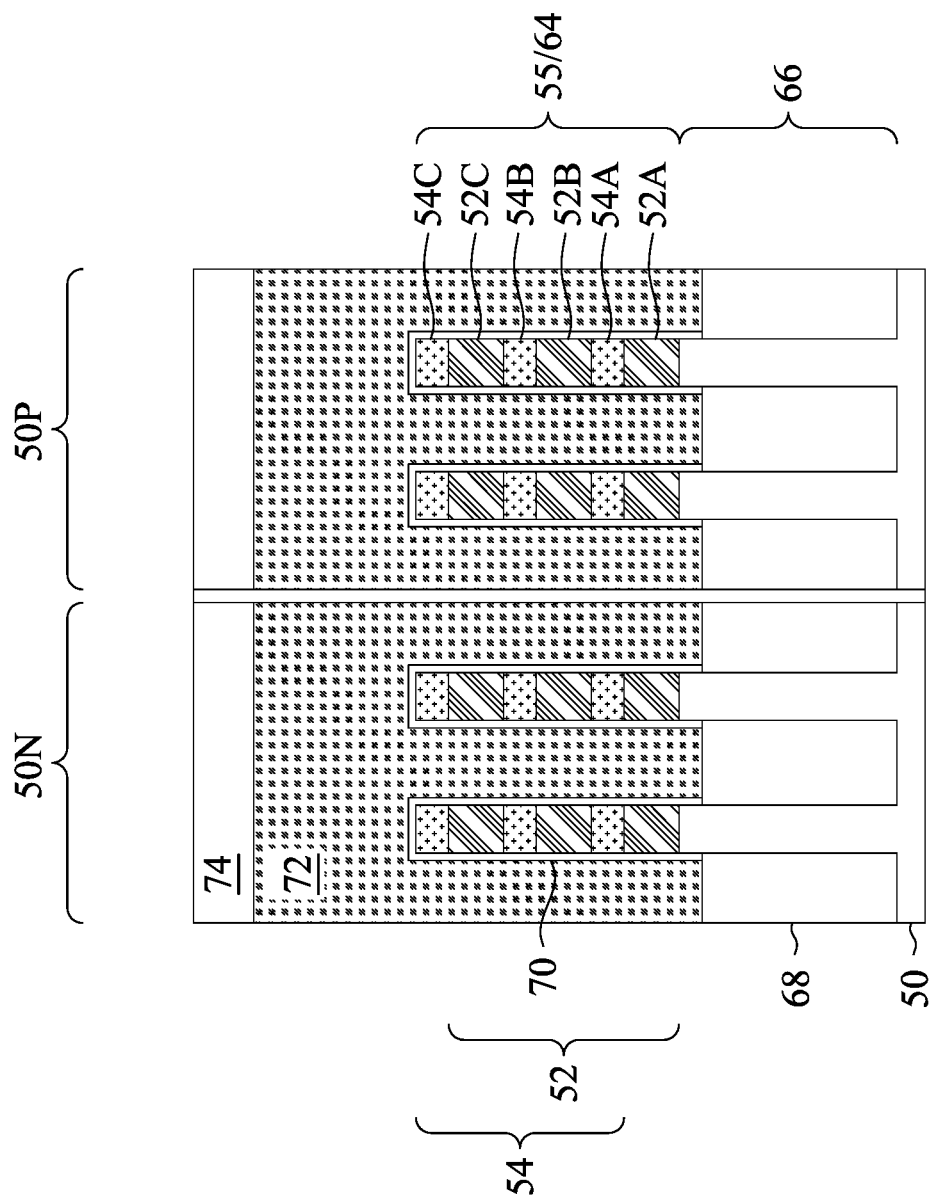

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
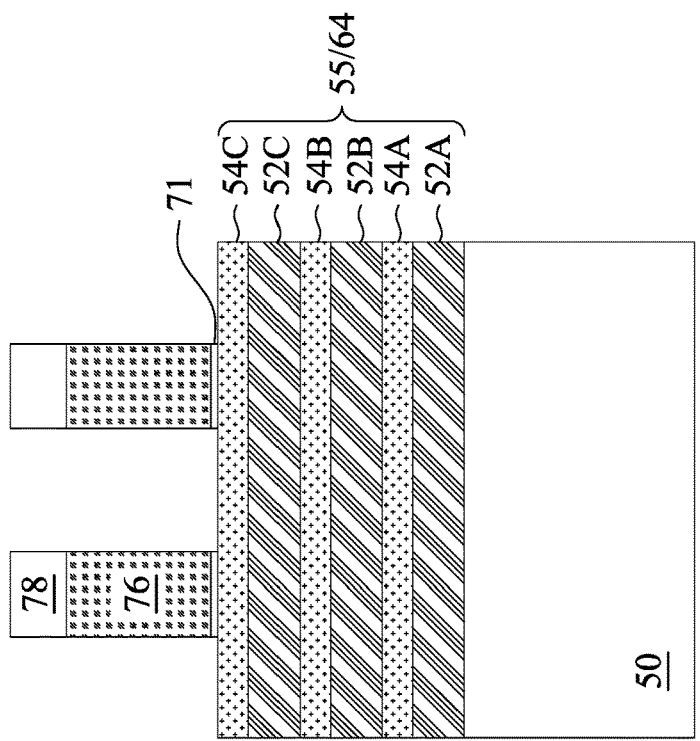
Figure 6A:
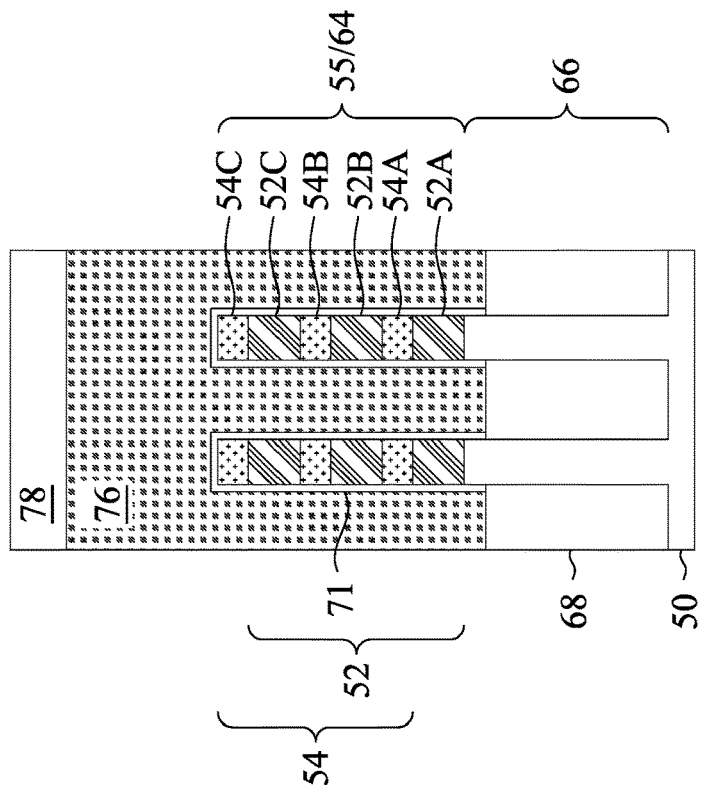

FIGS. 6A through 26B illustrate various additional steps in the manufacturing of embodiment devices. FIGS. 6A through 26B illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66 and portions of the second nanostructures 54, which form channel regions. The pattern of the masks 78 may be used to separate each of the dummy gates 76 from adjacent dummy gates 76. The dummy gates 76 may have lengthwise directions perpendicular to lengthwise directions of respective ones of the fins 66.

Figure 7B:
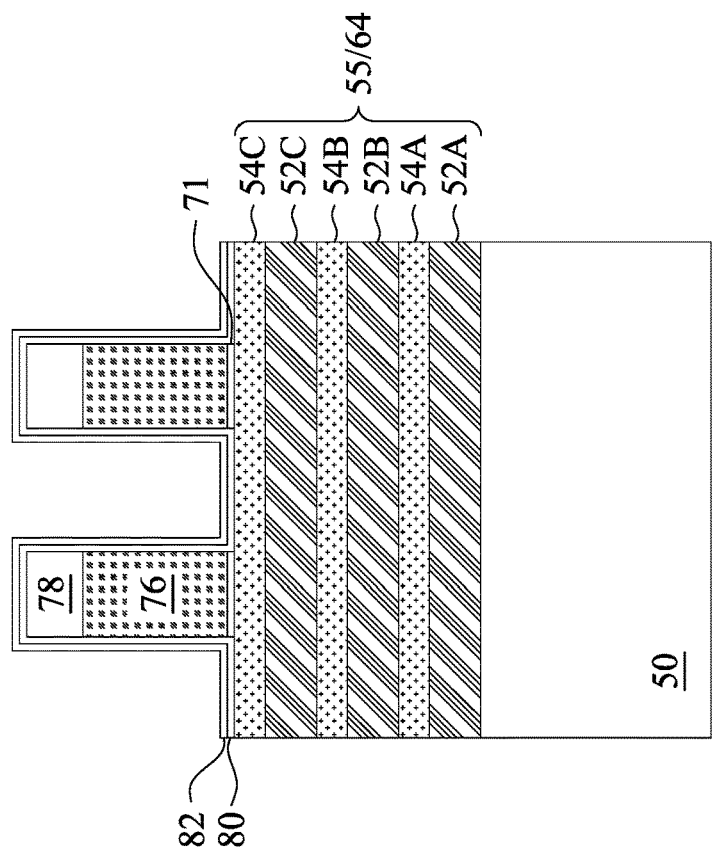
Figure 7A:
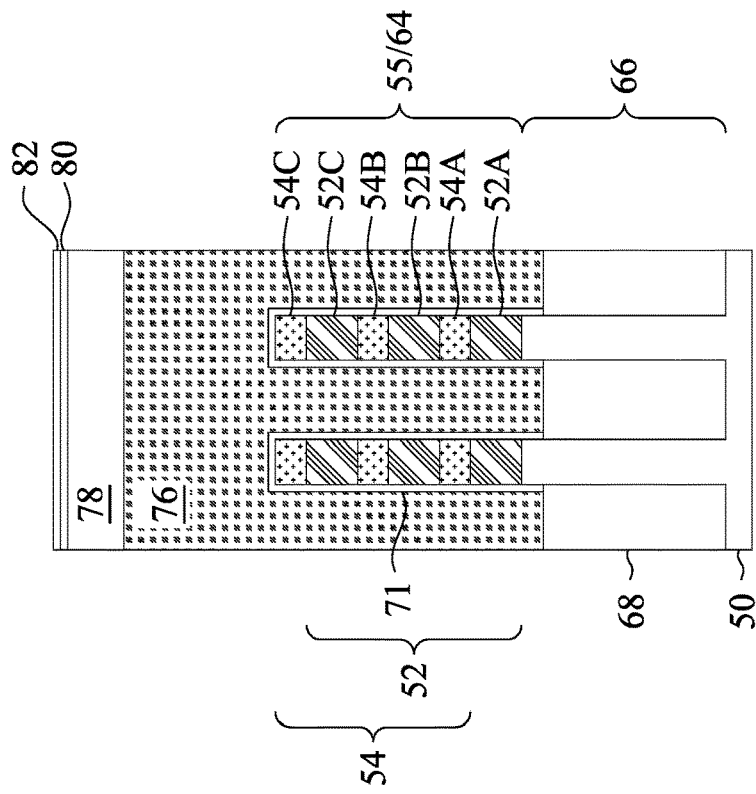
Figure 7C:
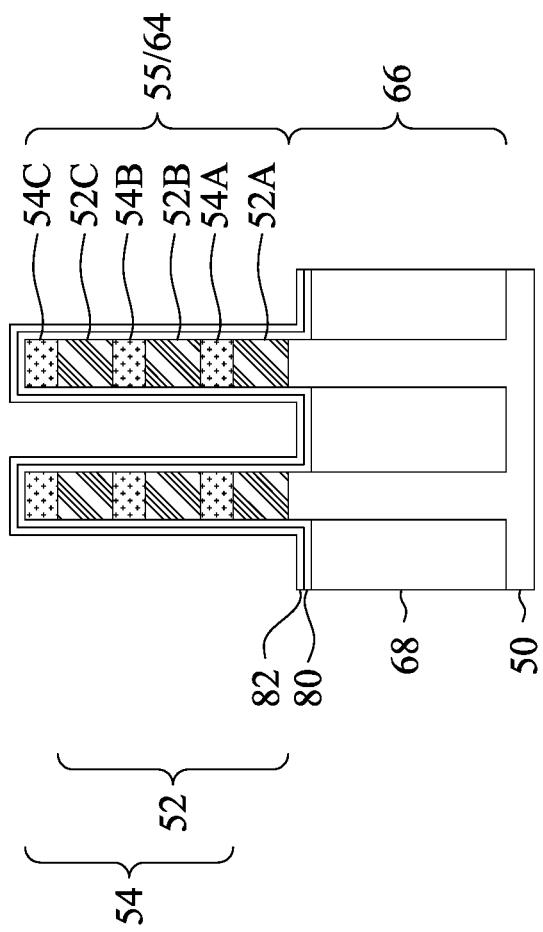

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; side surfaces of the fins 66, the dummy gate dielectrics 71, and the dummy gates 76; and top surfaces and side surfaces of the nanostructures 55 and the masks 78. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like. The first spacer layer 80 and the second spacer layer 82 may comprise low-k dielectric materials.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the exposed nanostructures 55 in the p-type region 50P. The mask may then be removed. Subsequently, a mask, such as a photoresist, may be formed over the p-type region 50P while exposing the n-type region 50N, and appropriate type (e.g., n-type) impurities may be implanted into the exposed fins 66 and the exposed nanostructures 55 in the n-type region 50N. The mask may then be removed. The n-type impurities may be the any of the n-type impurities previously discussed and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
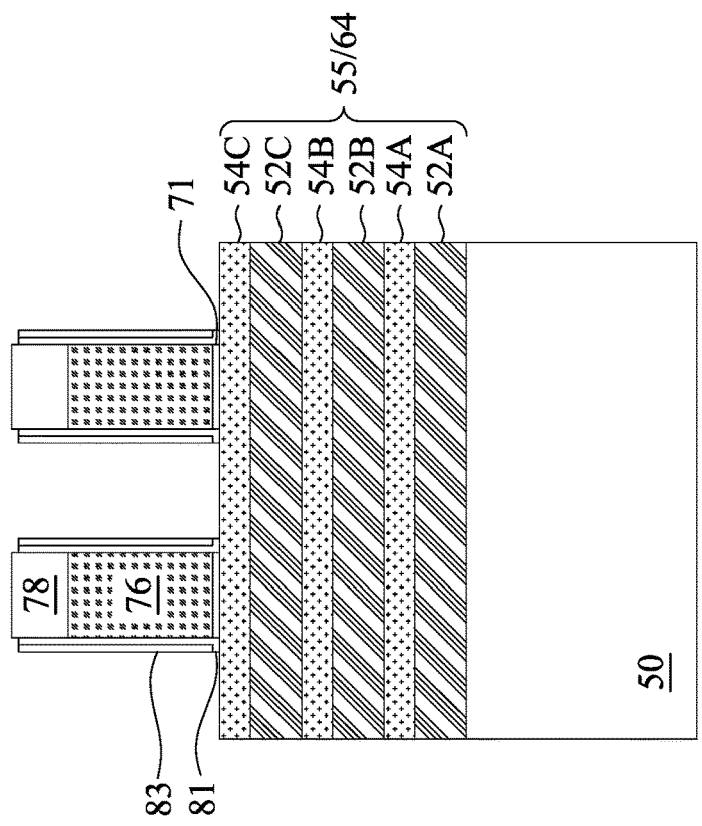
Figure 8A:
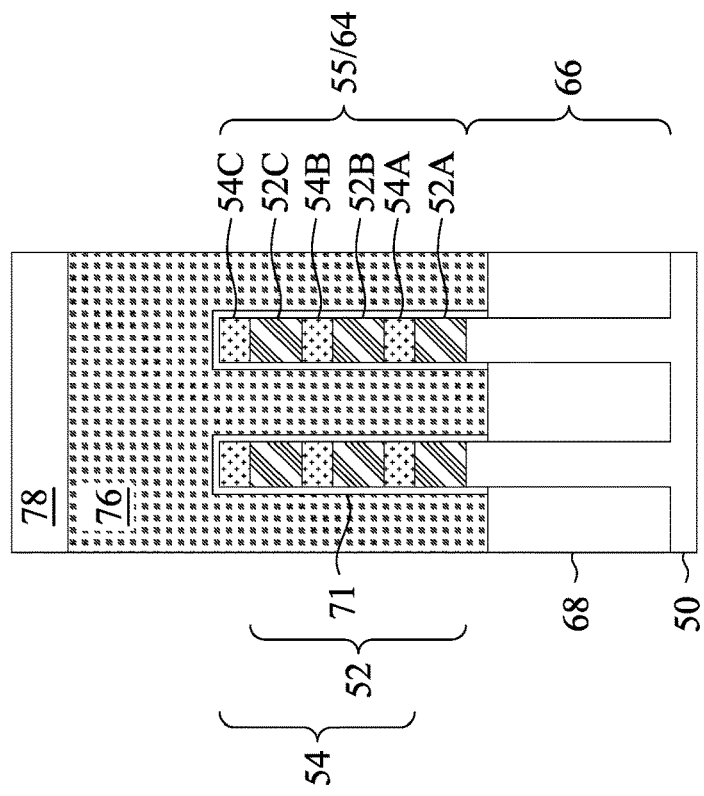
Figure 8C:
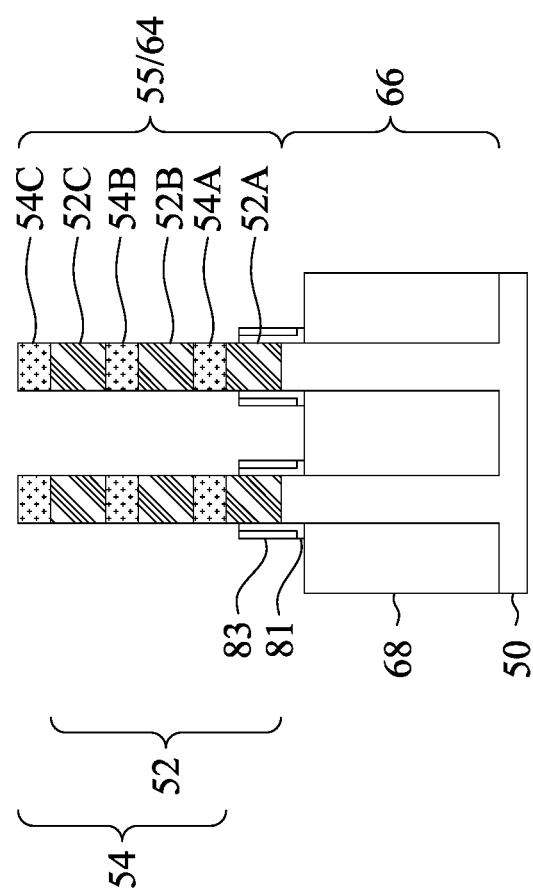

In FIGS. 8A through 8C, the first spacer layer 80 and the second spacer layer 82 are etched to form first spacers 81 and second spacers 83, respectively. As will be discussed in greater detail below, the first spacers 81 and the second spacers 83 act to self-align subsequently formed source/drain regions, as well as to protect sidewalls of the fins 66 and/or the nanostructures 55 during subsequent processing. The first spacer layer 80 and the second spacer layer 82 may be etched using suitable etching processes, such as isotropic etching processes (e.g., wet etching processes), anisotropic etching processes (e.g., dry etching processes), or the like. In some embodiments, the material of the second spacer layer 82 has a different etch rate than the material of the first spacer layer 80, such that the first spacer layer 80 may act as an etch stop layer when patterning the second spacer layer 82. The second spacer layer 82 may act as a mask when patterning the first spacer layer 80. For example, the second spacer layer 82 may be etched using an anisotropic etch process in which the first spacer layer 80 acts as an etch stop layer. Remaining portions of the second spacer layer 82 form the second spacers 83, as illustrated in FIGS. 8B and 8C. The second spacers 83 then act as a mask while etching exposed portions of the first spacer layer 80 forming the first spacers 81, as illustrated in FIGS. 8B and 8C.

As illustrated in FIG. 8B, the first spacers 81 and the second spacers 83 are disposed on sidewalls of the masks 78, the dummy gates 76, and the dummy gate dielectrics 71. In some embodiments, top surfaces of the first spacers 81 and the second spacers 83 may be disposed below top surfaces of the masks 78. The top surfaces of the first spacers 81 and the second spacers 83 may be disposed level with or above the top surfaces of the masks 78. In some embodiments, the second spacers 83 may be removed from over the first spacers 81 adjacent the masks 78, the dummy gates 76, and the dummy gate dielectrics 71. As illustrated in FIG. 8C, the first spacers 81 and the second spacers 83 are disposed on sidewalls of the fins 66 and/or nanostructures 55.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
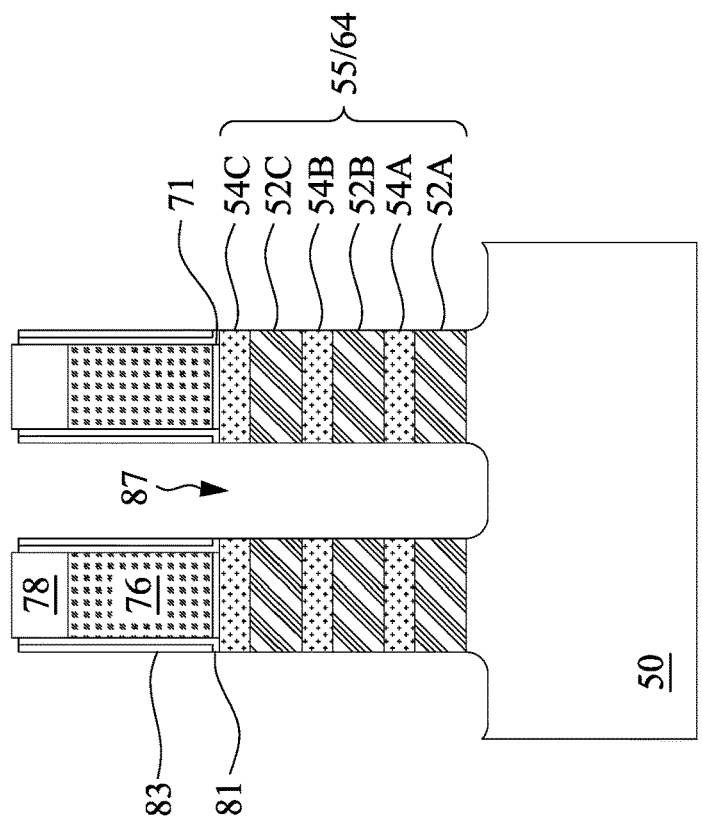
Figure 9A:
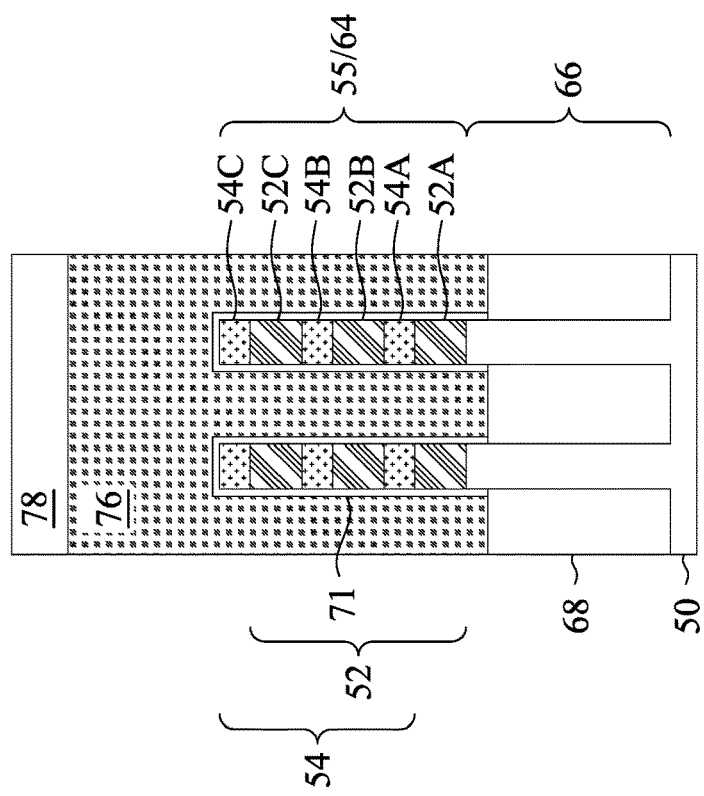
Figure 9C:
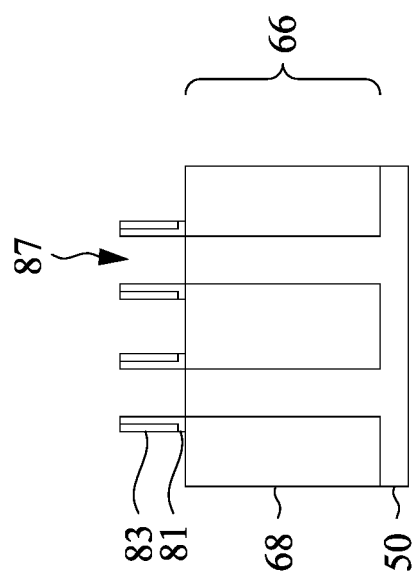

In FIGS. 9A through 9C, first recesses 87 are formed in the fins 66, the nanostructures 55, and the substrate 50. Epitaxial source/drain regions will be subsequently formed in the first recesses 87. The first recesses 87 may extend through the first nanostructures 52 and the second nanostructures 54, and into the substrate 50. In some embodiments, top surfaces of the STI regions 68 may be level with bottom surfaces of the first recesses 87. In some embodiments, the top surfaces of the STI regions 68 may be above or below the bottom surfaces of the first recesses 87. The first recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 87. A single etch process or multiple etch processes may be used to etch each layer of the nanostructures 55 and/or the fins 66. Timed etch processes may be used to stop the etching after the first recesses 87 reach desired depths.

Figure 10B:
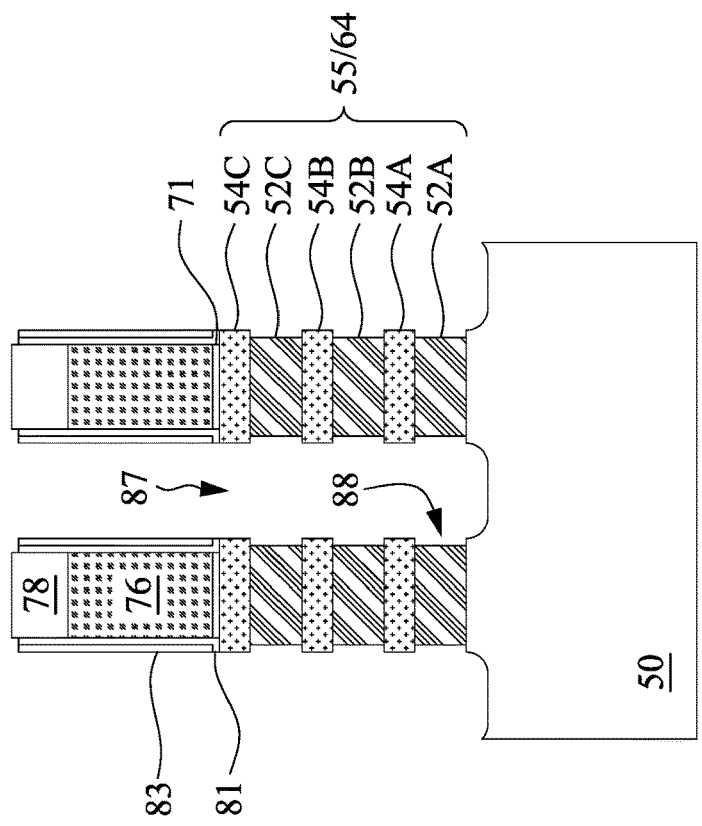
Figure 10A:
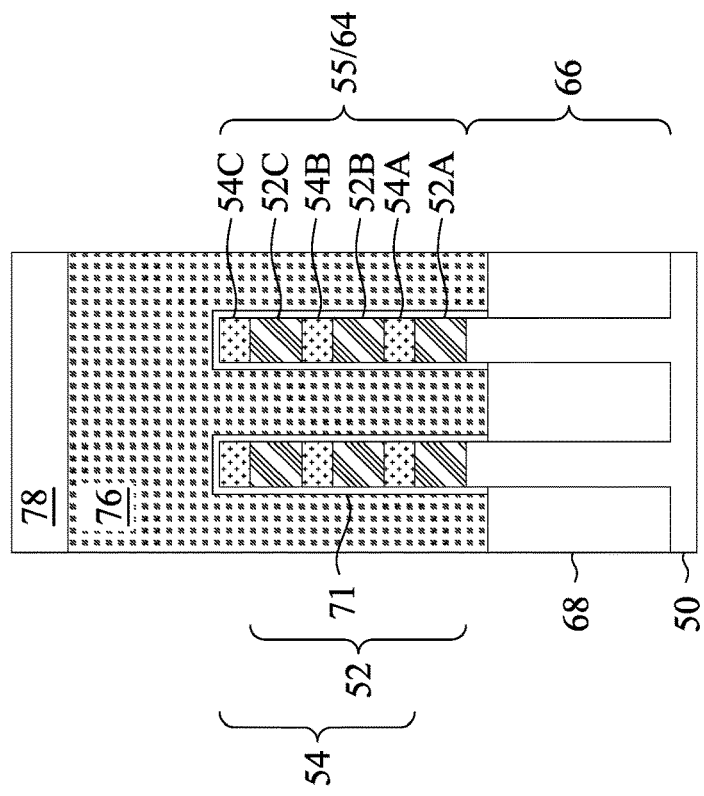

In FIGS. 10A and 10B, portions of sidewalls of the layers of the multi-layer stack 64 formed of the first semiconductor materials (e.g., the first nanostructures 52) exposed by the first recesses 87 are etched to form sidewall recesses 88. Although sidewalls of the first nanostructures 52 adjacent the sidewall recesses 88 are illustrated as being straight in FIG. 10B, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

Figure 11B:
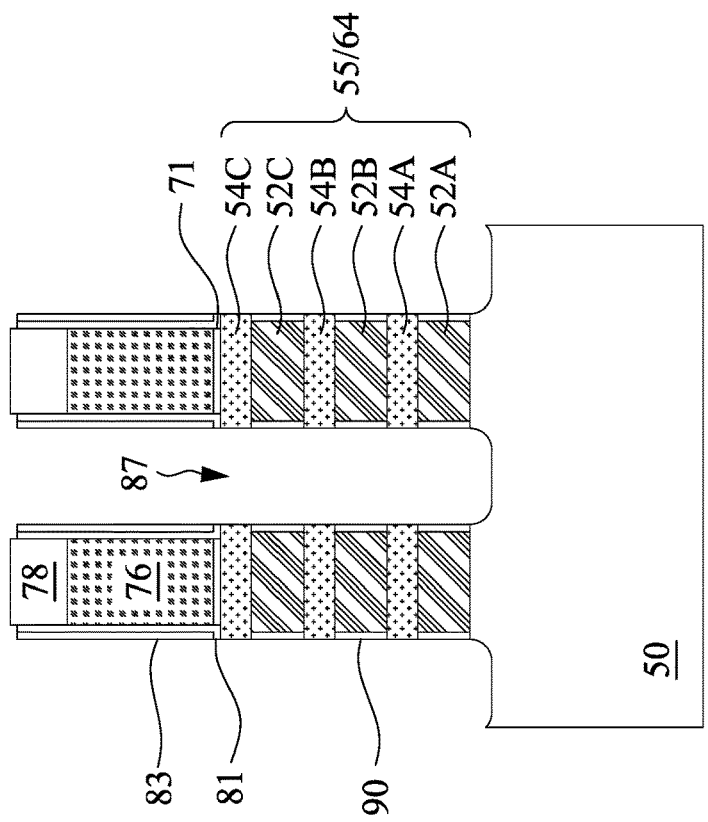
Figure 11A:
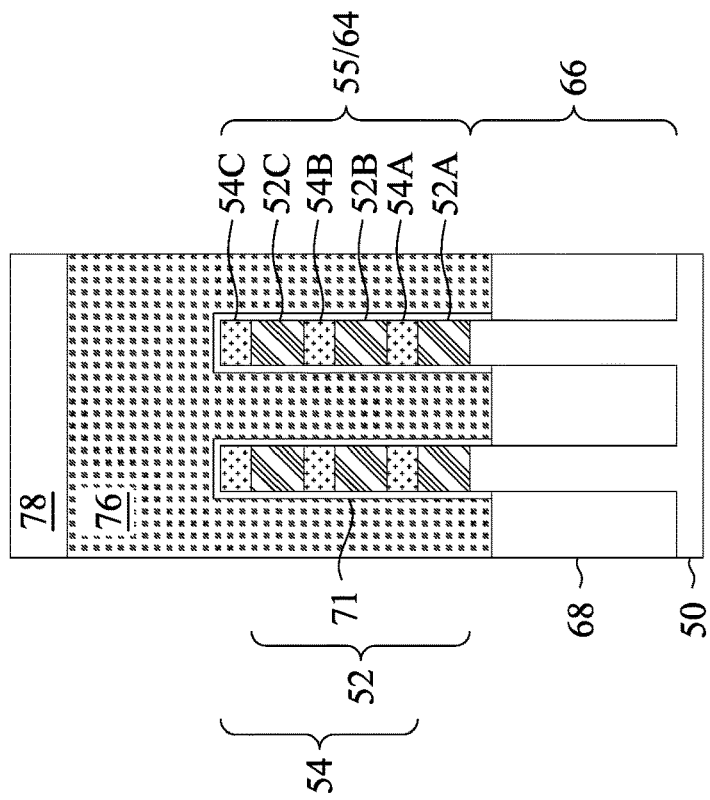
Figure 11C:
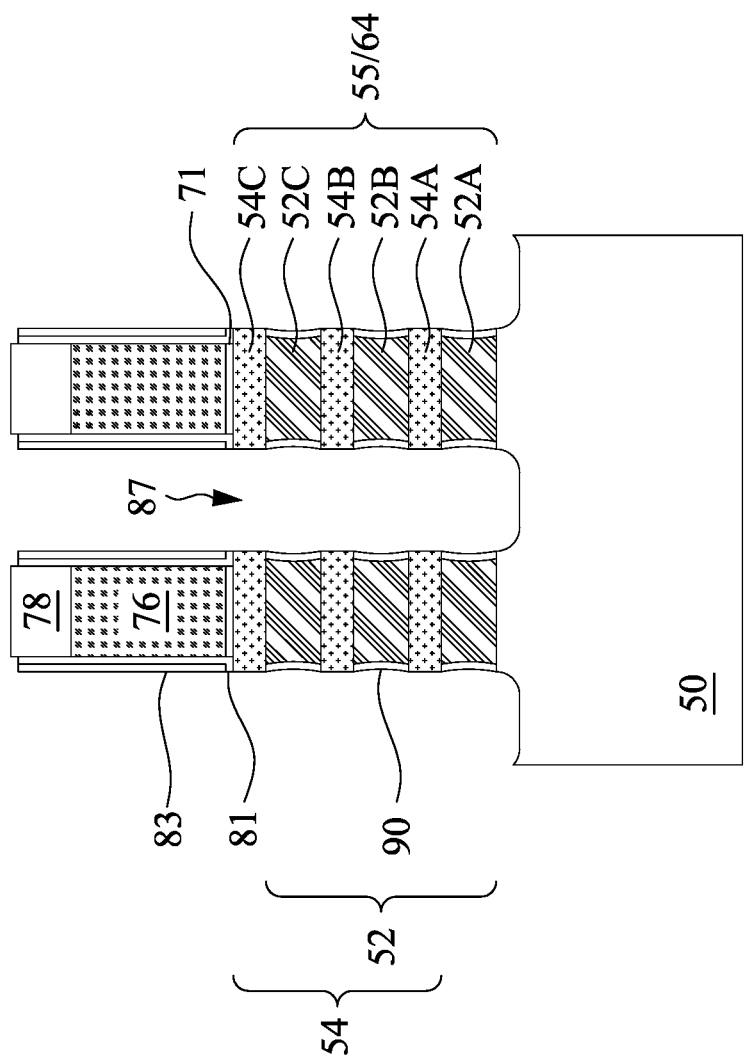

In FIGS. 11A through 11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and subsequently formed gate structures. As will be discussed in detail below, the source/drain regions will be formed in the first recesses 87, while the first nanostructures 52 will be replaced with the gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as flush with sidewalls of the second nanostructures 54, the outer sidewalls of the first inner spacers 90 may extend beyond or be recessed from sidewalls of the second nanostructures 54.

Moreover, although the outer sidewalls of the first inner spacers 90 are illustrated as straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

Figure 12B:
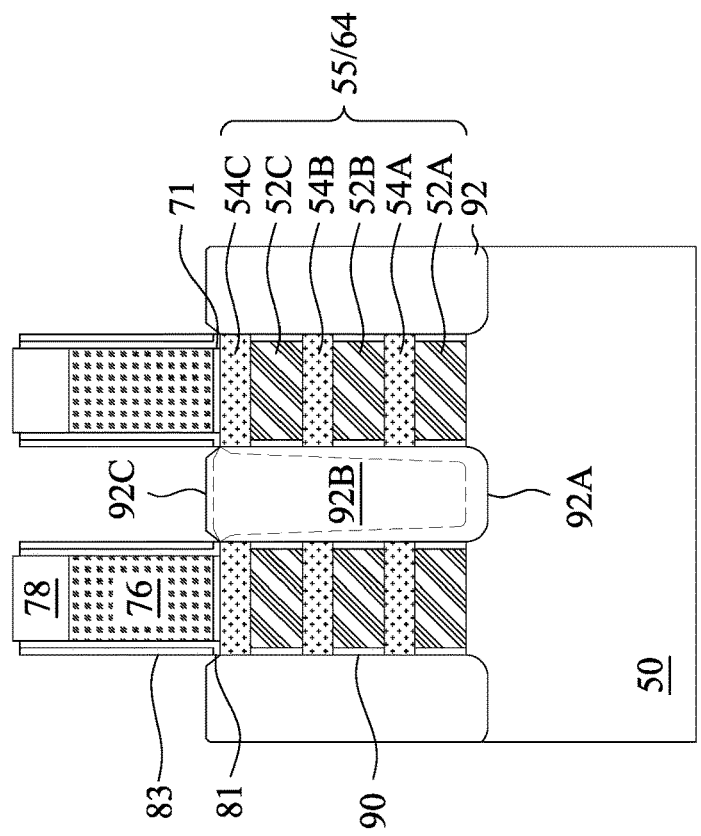

In FIGS. 12A through 12E, epitaxial source/drain regions 92 are formed in the first recesses 87. In some embodiments, the epitaxial source/drain regions 92 may exert stress on the second nanostructures 54, thereby improving performance. As illustrated in FIG. 12B, the epitaxial source/drain regions 92 are formed in the first recesses 87 such that each dummy gate 76 is disposed between respective neighboring pairs of the epitaxial source/drain regions 92. In some embodiments, the first spacers 81 and the second spacers 83 are used to separate the epitaxial source/drain regions 92 from the dummy gates 76 and the first inner spacers 90 are used to separate the epitaxial source/drain regions 92 from the first nanostructures 52 by appropriate lateral distances so that the epitaxial source/drain regions 92 do not short out subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 87 of the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous-doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 87 of the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective upper surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, the facets cause adjacent epitaxial source/drain regions 92 of a same nano-FET to merge as illustrated by FIG. 12C. In some embodiments, adjacent epitaxial source/drain regions 92 remain separated after the epitaxy process is completed as illustrated by FIG. 12D. In the embodiments illustrated in FIGS. 12C and 12D, the first spacers 81 may be formed over top surfaces of the STI regions 68 and may block the epitaxial growth. In some embodiments, the first spacers 81 may cover portions of sidewalls of the nanostructures 55, further blocking the epitaxial growth. In some embodiments, the spacer etch used to form the first spacers 81 may be adjusted to remove the spacer material to allow the epitaxial source/drain regions 92 to extend to the top surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
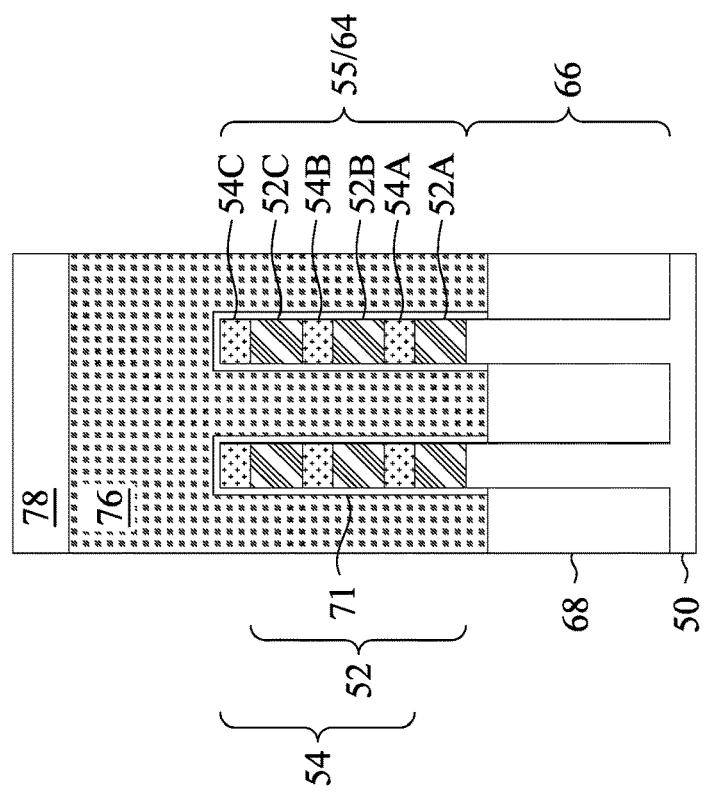
Figure 12C:
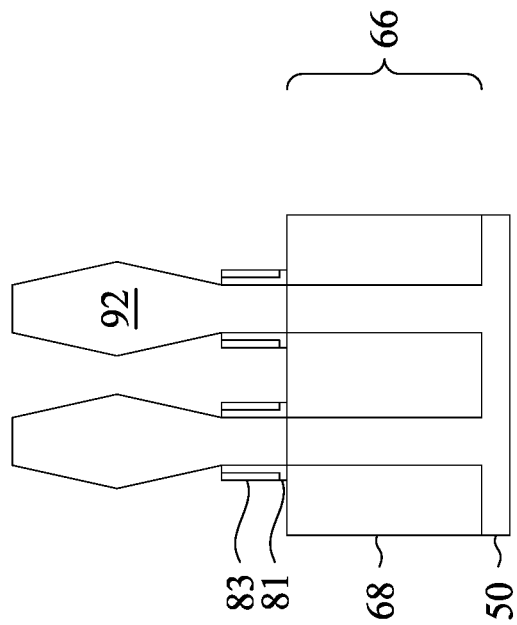
Figure 12D:
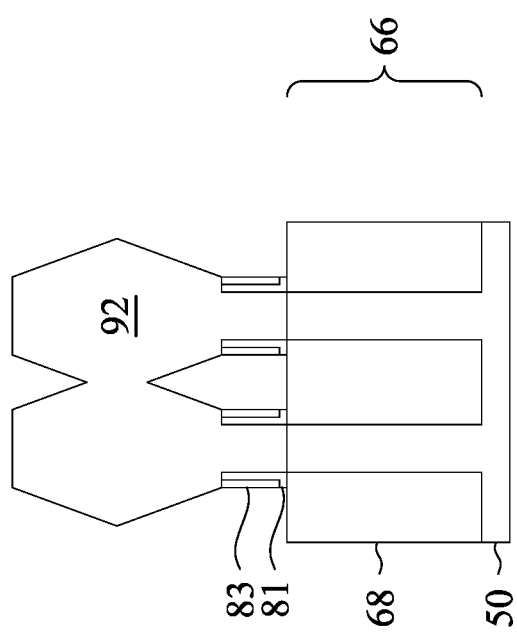
Figure 12E:
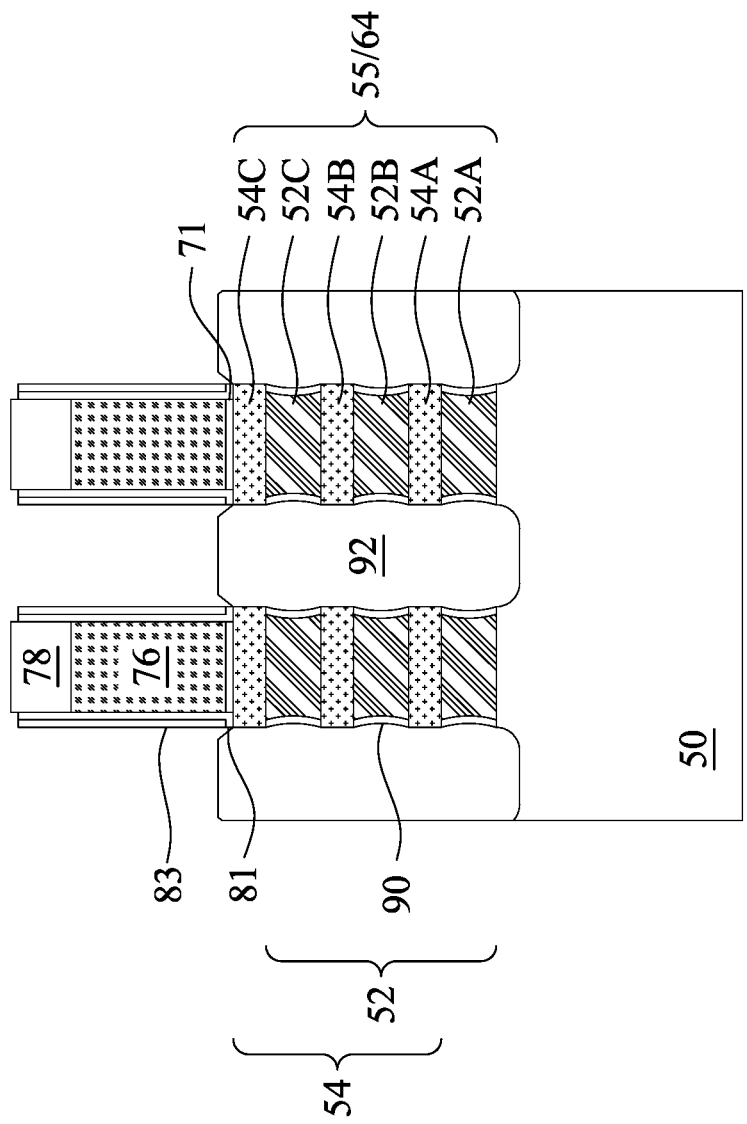

FIG. 12E illustrates an embodiment in which sidewalls of the first nanostructures 52 are concave and outer sidewalls of the first inner spacers 90 are concave. The first inner spacers 90 are recessed from sidewalls of the second nanostructures 54. As illustrated in FIG. 12E, the epitaxial source/drain regions 92 may be formed in contact with the first inner spacers 90. The epitaxial source/drain regions may extend past sidewalls of the second nanostructures 54.

Figure 13B:
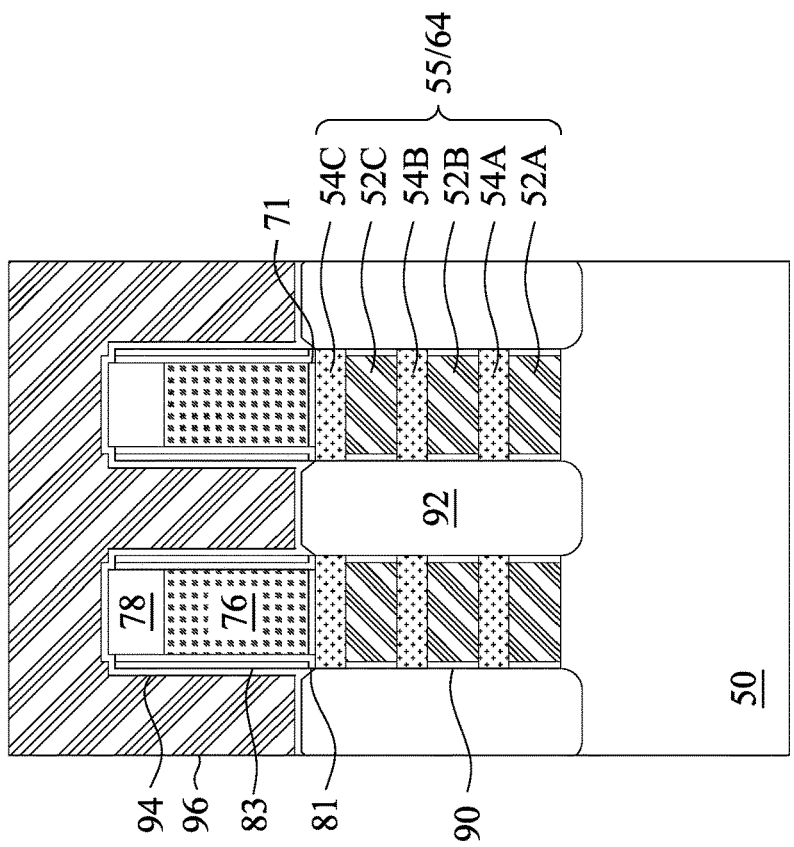
Figure 13A:
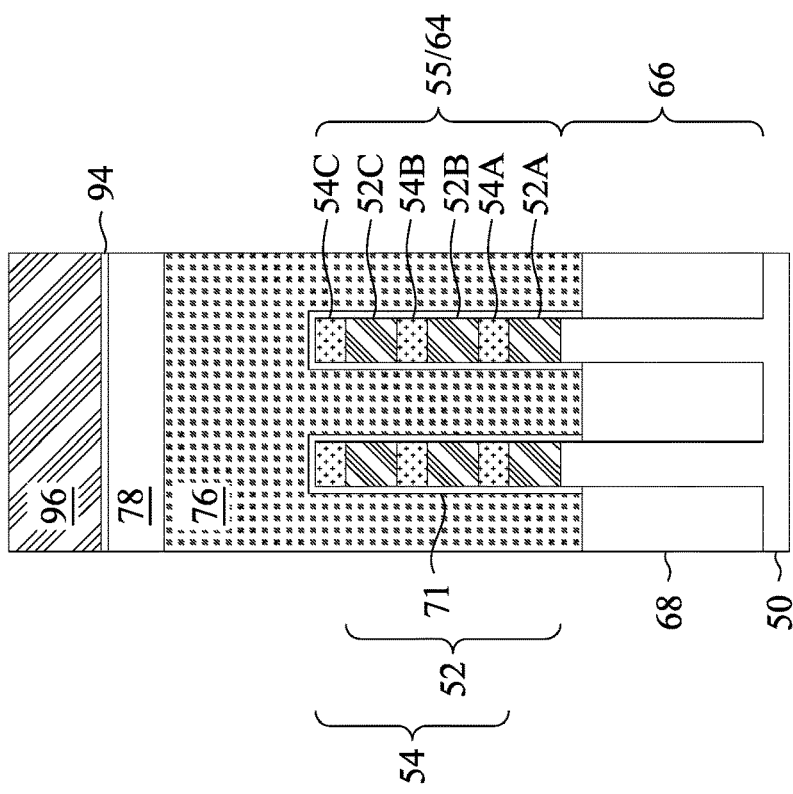

In FIGS. 13A and 13B, a first interlayer dielectric (ILD) 96 is deposited over the structure illustrated in FIGS. 12A and 12B. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), un-doped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
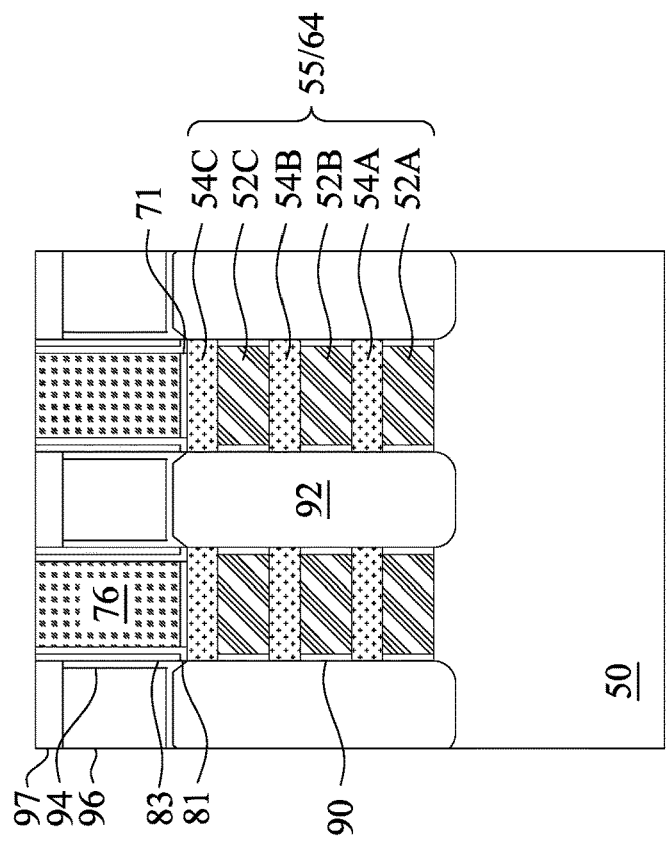
Figure 14A:
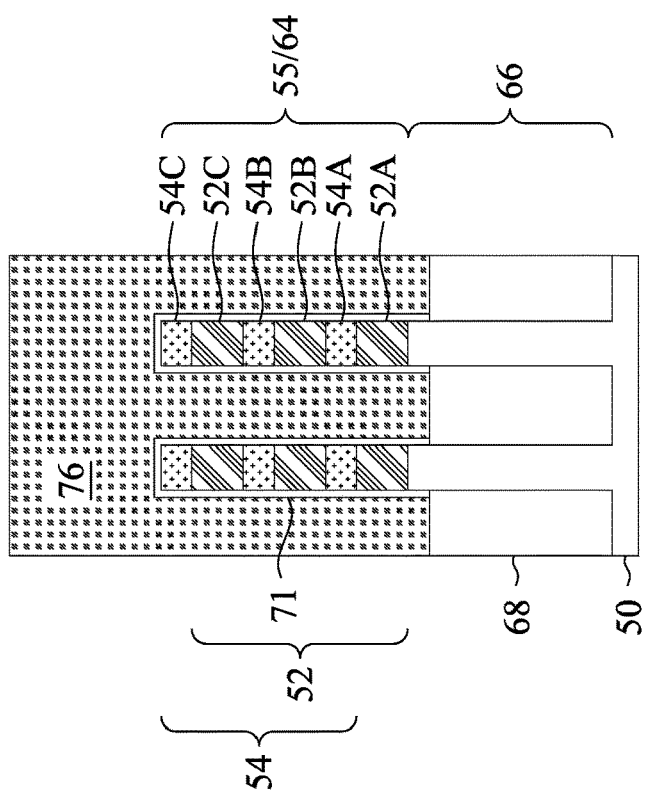

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Further, in FIGS. 14A and 14B, the first ILD 96 and the CESL 94 are etched back and a protection layer 97 is formed over the first ILD 96 and the CESL 94. The first ILD 96 and the CESL 94 may be etched back using anisotropic etch processes, such as RIE, NBE, or the like, or isotropic etch process, such as wet etch processes. The protection layer 97 may then be deposited over the resulting structure using CVD, PECVD, ALD, sputtering, or the like, and planarized using a process such as CMP. As illustrated in FIGS. 14A and 14B, following the planarization of the protection layer 97, top surfaces of the protection layer 97 may be level with top surfaces of the first spacers 81, the second spacers 83 and the dummy gates 76. The protection layer 97 may be formed of a material such as silicon nitride, silicon oxide, silicon oxycarbide, silicon oxycarbonitride, silicon carbonitride, combinations or multiple layers thereof, or the like. The protection layer 97 may be formed over the first ILD 96 and the CESL 94 in order to protect the first ILD 96 and the CESL 94 from subsequent etching processes.

Figure 15B:
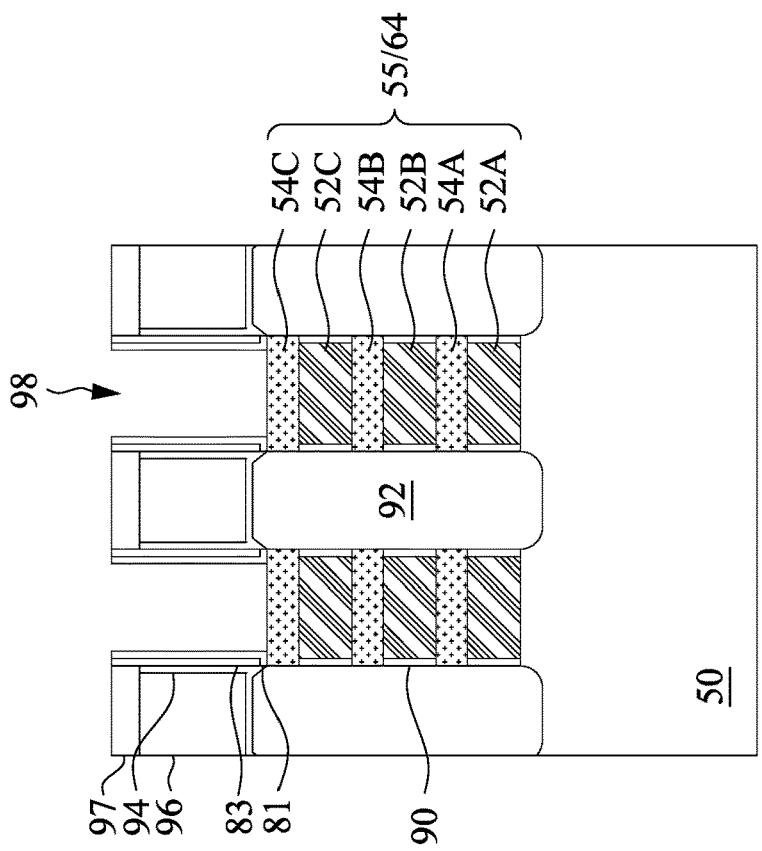
Figure 15A:
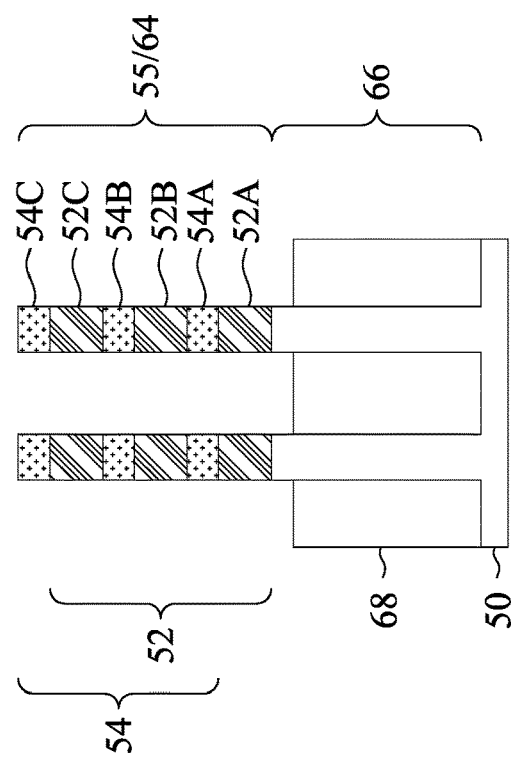

In FIGS. 15A and 15B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the protection layer 97, the first spacers 81, the second spacers 83, the nanostructures 55, or the STI regions 68. Each of the second recesses 98 exposes and/or overlies portions of nanostructures 55, which act as channel regions in subsequently completed nano-FETs. The portions of the nanostructures 55, which act as the channel regions, are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
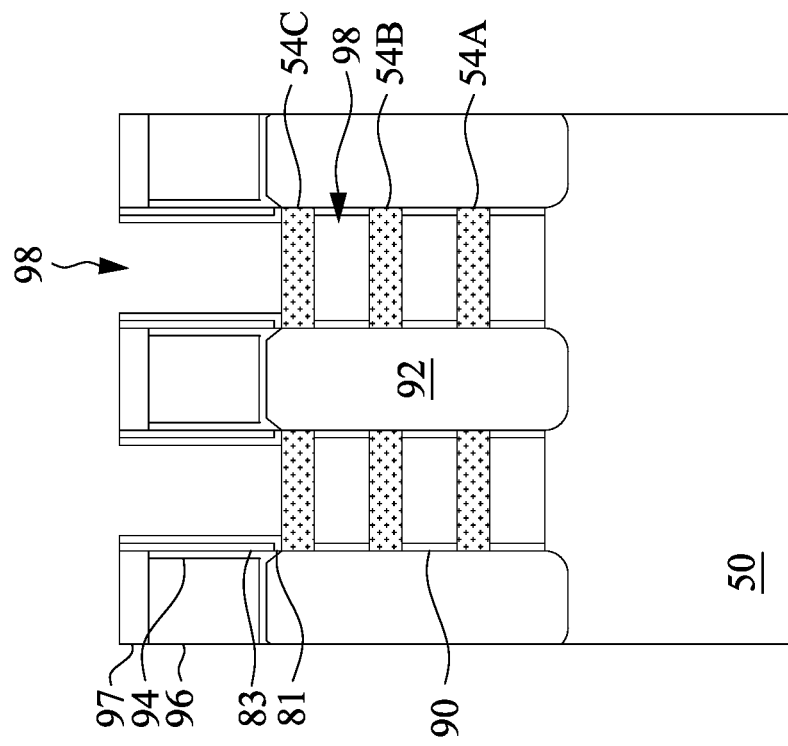
Figure 16A:
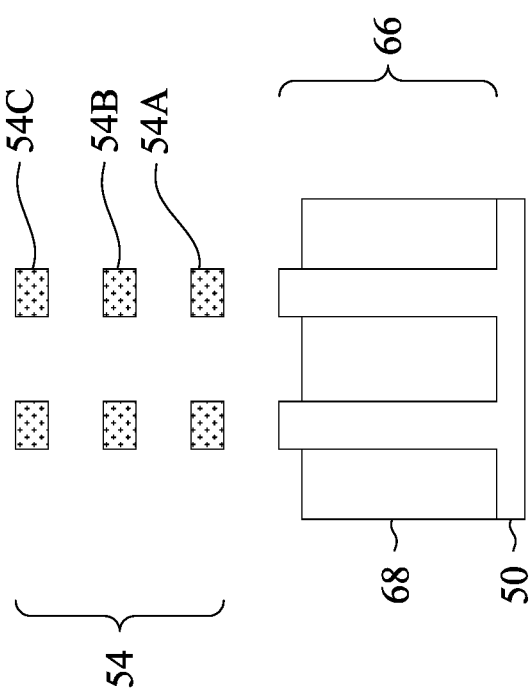

In FIGS. 16A and 16B, the first nanostructures 52 are removed extending the second recesses 98. The first nanostructures 52 may be removed by performing an isotropic etching process such as wet etching or the like using etchants selective to the materials of the first nanostructures 52, while the second nanostructures 54, the substrate 50, and the STI regions 68 remain relatively un-etched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52.

In FIGS. 17A through 23H, gate dielectric layers and gate electrodes are formed for replacement gates in the second recesses 98. The gate electrodes formed in the n-type region 50N include an anti-reaction layer, which provides a threshold voltage (Vt) boost. An n-type work function layer is formed over the anti-reaction layer and a p-type work function layer is formed over and covering the anti-reaction layer and the n-type work function layer. A metal cap layer is then formed over the p-type work function layer. Forming the p-type work function layer covering the anti-reaction layer allows the metal cap layer to be selectively deposited. The metal cap layer reduces gate resistance. Device performance may thus be improved.

The formation of the gate dielectric layers in the n-type region 50N and the p-type region 50P may occur simultaneously such that the gate dielectrics in each region are formed from the same materials. The formation of the gate electrodes may occur simultaneously such that the gate electrodes in each region are formed from the same materials. In some embodiments, the gate dielectric layers in each region may be formed by distinct processes, such that the gate dielectric layers may be different materials and/or may have different numbers of layers. The gate electrodes in each region may be formed by distinct processes, such that the gate electrodes may be different materials and/or have different numbers of layers. Various masking steps may be used to mask and expose appropriate regions when using distinct processes. In the following description, at least portions of the gate electrodes of the n-type region 50N and the gate electrodes of the p-type region 50P are formed separately.

Figure 17B:
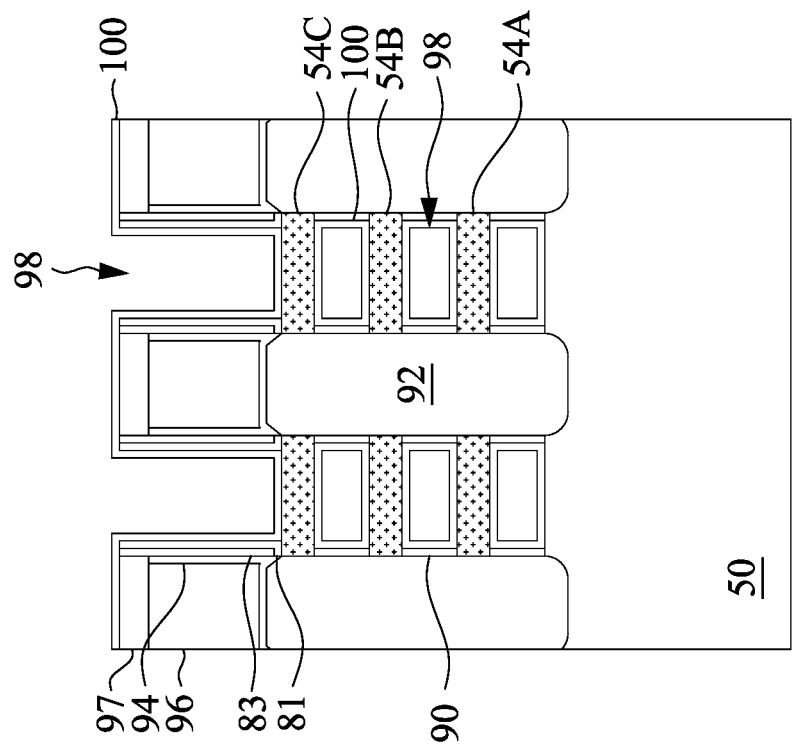
Figure 17A:
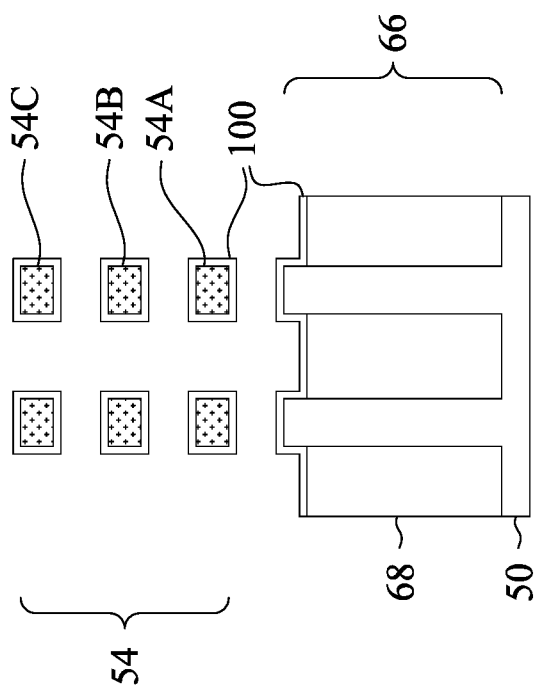

In FIGS. 17A and 17B, gate dielectric layers 100 are deposited conformally in the second recesses 98 in the n-type region 50N and the p-type region 50P. The gate dielectric layers 100 may be formed on top surfaces and side surfaces of the fins 66 and on top surfaces, side surfaces, and bottom surfaces of the second nanostructures 54. The gate dielectric layers 100 may also be deposited on top surfaces of the protection layer 97, the second spacers 83, and the STI regions 68; on top surfaces and side surfaces of the first spacers 81; and on side surfaces of the first inner spacers 90. The gate dielectric layers 100 comprise one or more dielectric layers, such as an oxide, a metal oxide, the like, or combinations thereof. In some embodiments, the gate dielectric layers 100 may comprise first gate dielectric layers (e.g., comprising silicon oxide or the like) and second gate dielectric layers (e.g., comprising a metal oxide or the like) over the first gate dielectric layers. In some embodiments, the second gate dielectric layers include a high-k dielectric material. In these embodiments, the second gate dielectric layers may have a k-value greater than about 7.0, and may include a metal oxide or a silicate of hafnium, aluminum, zirconium, lanthanum, manganese, barium, titanium, lead, and combinations thereof. The first gate dielectric layers may be referred to as interfacial layers, and the second gate dielectric layers may be referred to as high-k gate dielectric layers, in some embodiments.

The structure of the gate dielectric layers 100 may be the same or different in the n-type region 50N and the p-type region 50P. For example, the p-type region 50P may be masked or exposed while forming the gate dielectric layers 100 in the n-type region 50N. In embodiments where the p-type region 50P is exposed, the gate dielectric layers 100 may be simultaneously formed in the p-type regions 50P. The formation methods of the gate dielectric layers 100 may include molecular-beam deposition (MBD), ALD, CVD, PVD, and the like.

Figure 18B:
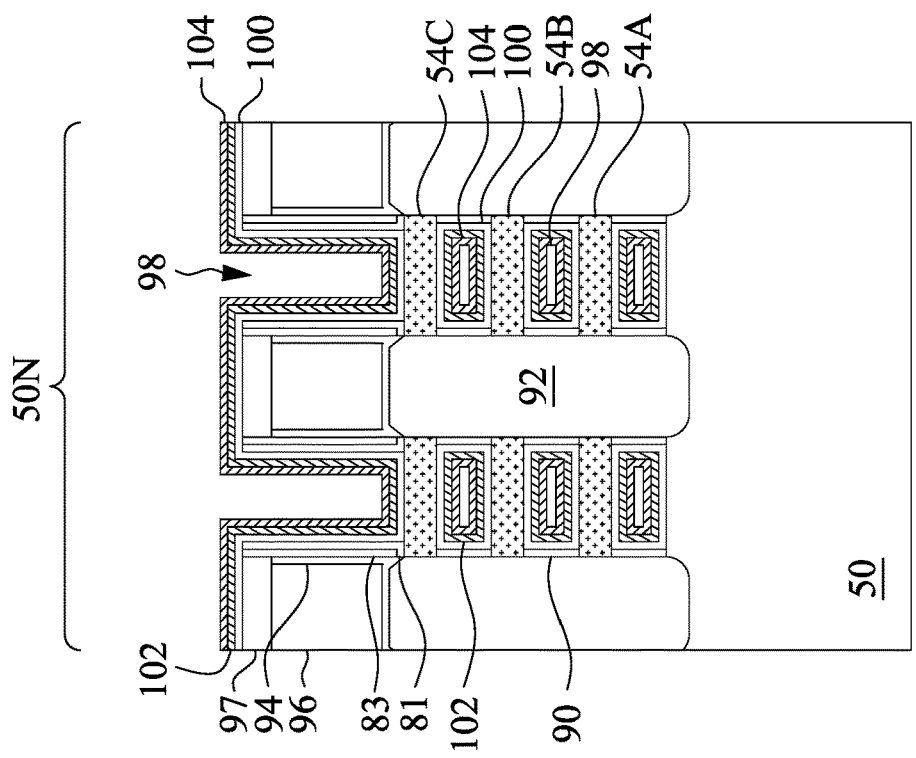
Figure 18A:
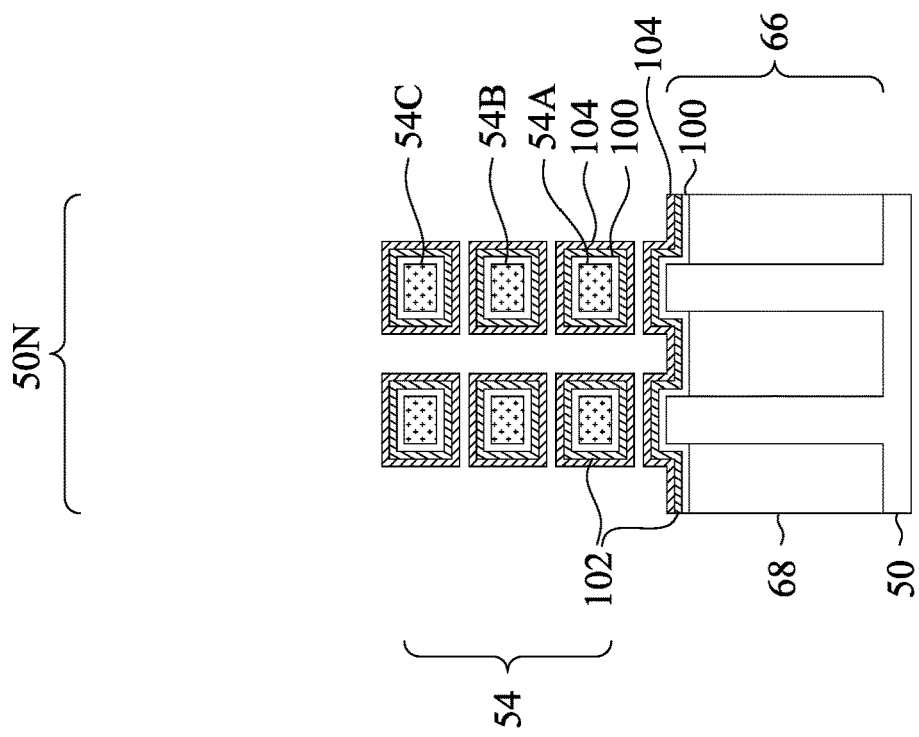

In FIGS. 18A and 18B, a first conductive material 102 is deposited conformally over the gate dielectric layers 100 in the n-type region 50N. The p-type region 50P may be masked while the first conductive material 102 is deposited in the n-type region 50N. In some embodiments, the first conductive material 102 is an n-type work function layer, which may comprise AlCu, TiAlC, TiAlN, TiAl, Al, TaAl, TaAlC, Ti, Al, Mg, Zn, other suitable n-type work function materials, combinations thereof, or the like. In some embodiments, the first conductive material 102 may comprise an aluminum-based material. The first conductive material 102 may be deposited by ALD, CVD, PVD, or the like. The first conductive material 102 may be deposited to a thickness ranging from about 1 nm to about 4 nm.

In some embodiments, intermediate layers (not separately illustrated) may be formed over the first conductive material 102 before depositing anti-reaction layers 104. The intermediate layers may include barrier layers, diffusion layers, adhesion layers, combinations or multiple layers thereof, or the like. In some embodiments, the intermediate layers may comprise materials including chlorine (Cl) or the like. The intermediate layers may be deposited by ALD, CVD, PVD, or the like.

Further, in FIGS. 18A and 18B, anti-reaction layers 104 are deposited conformally over the first conductive material 102 in the n-type region 50N. The p-type region 50P may be masked while the anti-reaction layers 104 are deposited in the n-type region 50N. The anti-reaction layers 104 may protect the first conductive material 102 from oxidation. The anti-reaction layers 104 may be formed of materials different from the materials of the first conductive material 102. In some embodiments, the anti-reaction layers 104 may comprise dielectric materials. In some embodiments, the anti-reaction layers 104 may comprise silicon-based materials. In some embodiments, the anti-reaction layers 104 may comprise silicon (Si), silicon oxide (SiO$_x$), silicon nitride (SiN), silicon oxynitride (SiON), silicon carbonitride (SiCN), silicon carbide (SiC), combinations or multiple layers thereof, or the like. However, any suitable material may be utilized. The anti-reaction layers 104 may be formed by using a deposition process such as ALD, CVD, PVD, or the like. The anti-reaction layers 104 may be deposited to thicknesses ranging from about 0.3 nm to about 5 nm. The thicknesses of the anti-reaction layers 104 may be between 10% and 50% of the thickness of the first conductive material 102. This ratio allows for space savings, while still being effective to prevent or reduce oxidation of the first conductive material 102.

In some embodiments, the anti-reaction layers 104 may be formed in situ following the formation of the first conductive material 102, without moving the intermediately formed device. Thus, the anti-reaction layers 104 may be formed on the first conductive material 102 without breaking the vacuum of the deposition tool or apparatus, such as a processing chamber. In some embodiments, the intermediately formed device may be moved to another processing chamber within the same tool, without breaking the vacuum. Because the vacuum is maintained, oxidation of the first conductive material 102 may be eliminated or significantly reduced.

Including the anti-reaction layers 104 provides a threshold voltage boost for gate electrodes in the n-type regions 50N, which allows the threshold voltages to be appropriately tuned with thinner thicknesses of the first conductive material 102. This allows for greater space in which to deposit subsequently formed metal fills. For example, in some embodiments, the combination of the thickness of the first conductive material 102 and the thickness of the anti-reaction layers 104 may be between 50% and 80% the thickness of the same material of a first conductive material that exhibits the same or similar threshold voltage without the anti-reaction layers 104.

Figure 19B:
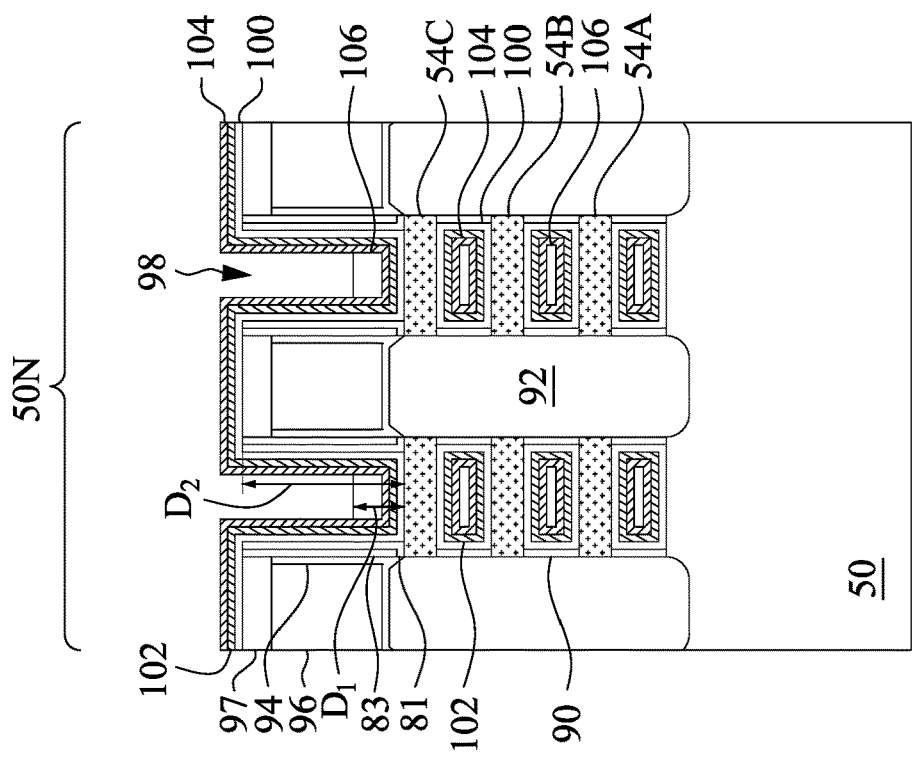
Figure 19A:
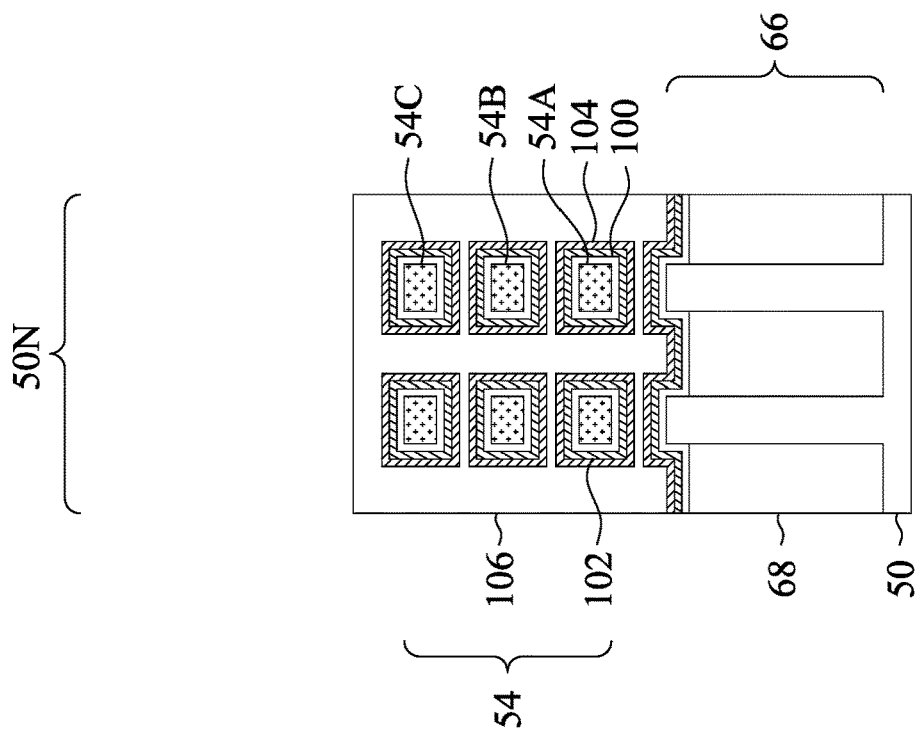

In FIGS. 19A and 19B, a first mask layer 106 is formed in the second recesses 98 over the anti-reaction layers 104. The first mask layer 106 may be deposited by spin-on-coating or the like. The first mask layer 106 may include a polymer material, such as poly(methyl)acrylate, poly(maleimide), novolacs, poly(ether)s, combinations thereof, or the like. In some embodiments, the first mask layer 106 may be a bottom anti-reflective coating (BARC) material. As illustrated in FIGS. 19A and 19B, the first mask layer 106 may fill portions of the second recesses 98 extending between vertically adjacent ones of the second nanostructures 54 and extending between the second nanostructures 54 and the fins 66.

After the first mask layer 106 is deposited, the first mask layer 106 may be etched back such that top surfaces of the first mask layer 106 are below top surfaces of the protection layer 97 and above top surfaces of the second nanostructures 54. The first mask layer 106 may be etched by one or more etching processes, such as isotropic etching processes (e.g., wet etching processes), anisotropic etching processes (e.g., dry etching processes), combinations thereof, or the like. The first mask layer 106 may be etched back using an etching process that is selective to the material of the first mask layer 106 (e.g., etches the material of the first mask layer 106 at a faster rate than the material of the anti-reaction layers 104). The top surfaces of the first mask layer 106 may be disposed above top surfaces of the second nanostructures 54C a distance $D_1$ ranging from about 5 nm to about 20 nm. Top surfaces of the first spacers 81, the second spacers 83, and the protection layer 97 may be disposed above the top surfaces of the second nanostructures 54C a distance $D_2$ ranging from about 25 nm to about 120 nm. A ratio of the distance $D_1$ to the distance $D_2$ may range from about 5 to about 24.

Figure 20B:
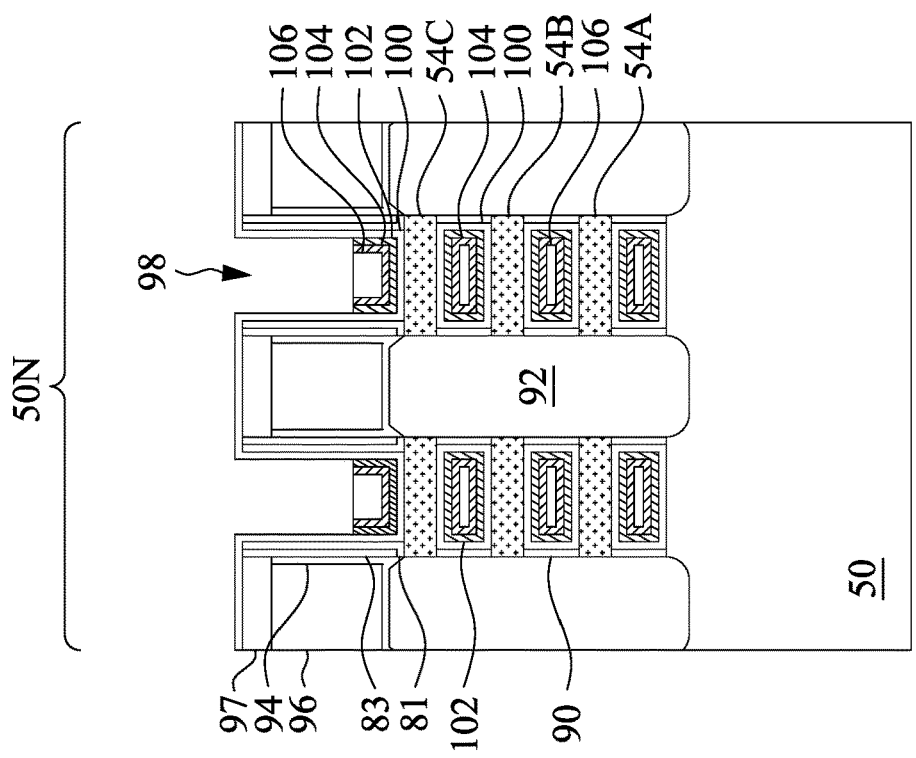
Figure 20A:
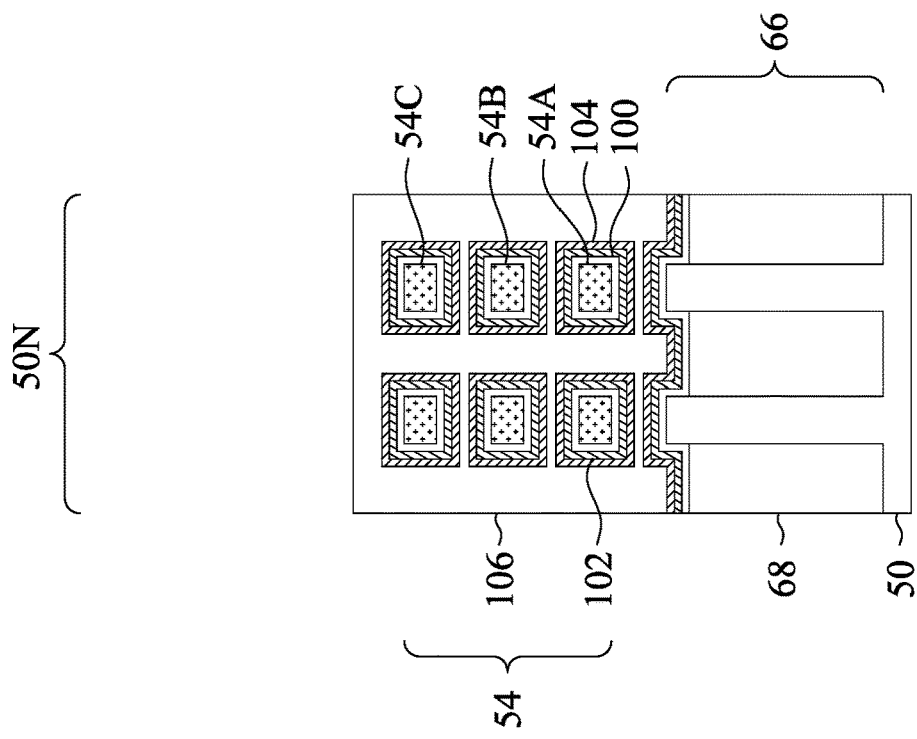

In FIGS. 20A and 20B, the anti-reaction layers 104 and the first conductive material 102 are etched. The anti-reaction layers 104 and the first conductive material 102 may be etched by one or more etching processes, such as isotropic etching processes (e.g., wet etching processes), anisotropic etching processes (e.g., dry etching processes), combinations thereof, or the like. In some embodiments, the anti-reaction layers 104 may be etched by a first etching process using the first mask layer 106 as a mask. The first etching process may expose top portions and sidewall portions of the first conductive material 102. The first conductive material 102 may then be etched by a second etching process using the anti-reaction layers 104 and the first mask layer 106 as a mask. In some embodiments, the first etching process and the second etching process may be isotropic wet etching processes. In some embodiments, the anti-reaction layers 104 and the first conductive material 102 may be etched simultaneously. As illustrated in FIG. 20B, the anti-reaction layers 104 and the first conductive material 102 may be etched such that top surfaces of the anti-reaction layers 104 and the first conductive material 102 are level with top surfaces of the first mask layer 106 and with one another. In some embodiments, the top surfaces of the anti-reaction layers 104 and the first conductive material 102 may be disposed at different levels.

Figure 20D:
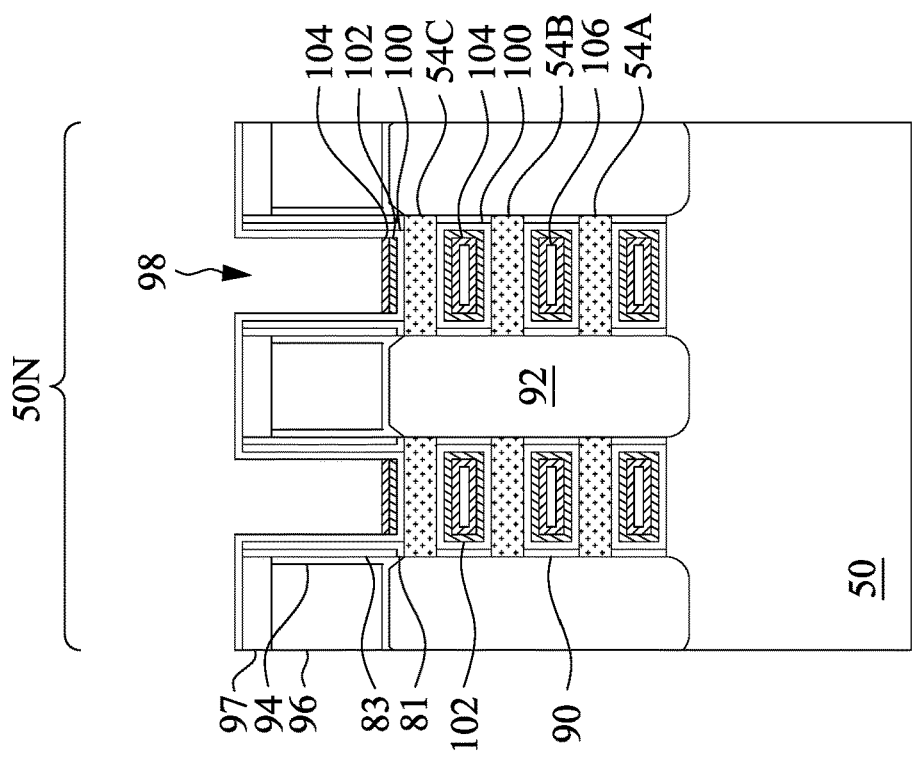
Figure 20C:
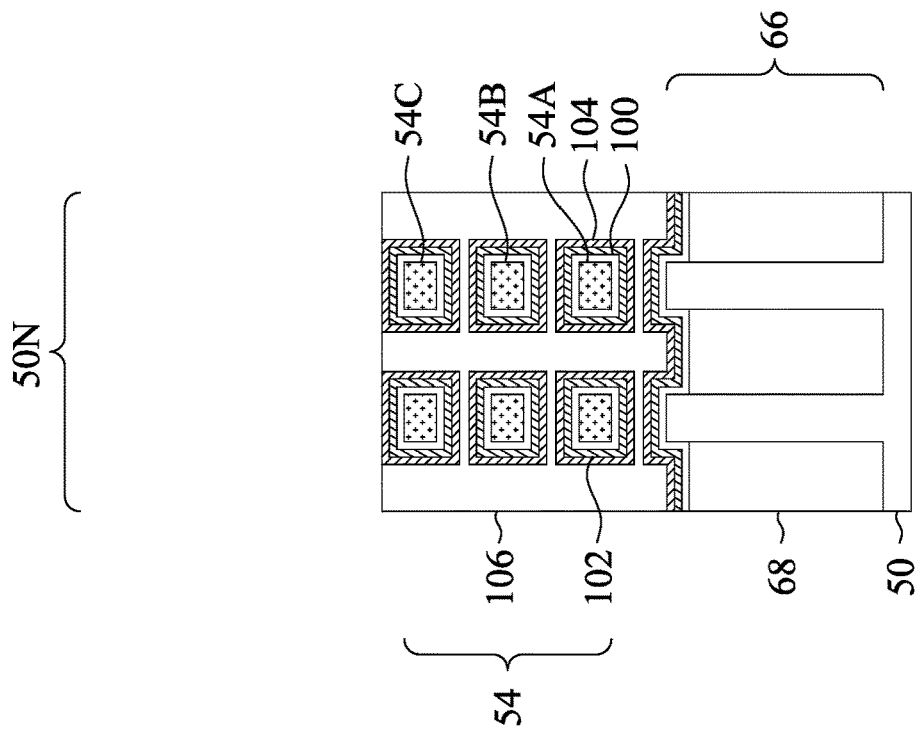

FIGS. 20C and 20D illustrate an embodiment in which the first conductive material 102 and the anti-reaction layers 104 are etched back to form planar regions adjacent the first spacers 81 and the second spacers 83. In some embodiments, the first conductive material 102 may be etched back before depositing the anti-reaction layers 104, the anti-reaction layers 104 may be deposited, and the first mask layer 106 may be formed and used to etch the anti-reaction layers 104. As illustrated in FIG. 20C, top surfaces of the anti-reaction layers 104 may be level with top surfaces of the first mask layer 106. As illustrated in FIG. 20D, top surfaces of the first conductive material 102 and the anti-reaction layers 104 may be flat and may extend between opposite side surfaces of the gate dielectric layers 100. The top surfaces of the anti-reaction layers 104 may be disposed above the top surfaces of the first conductive material 102.

Figure 21B:
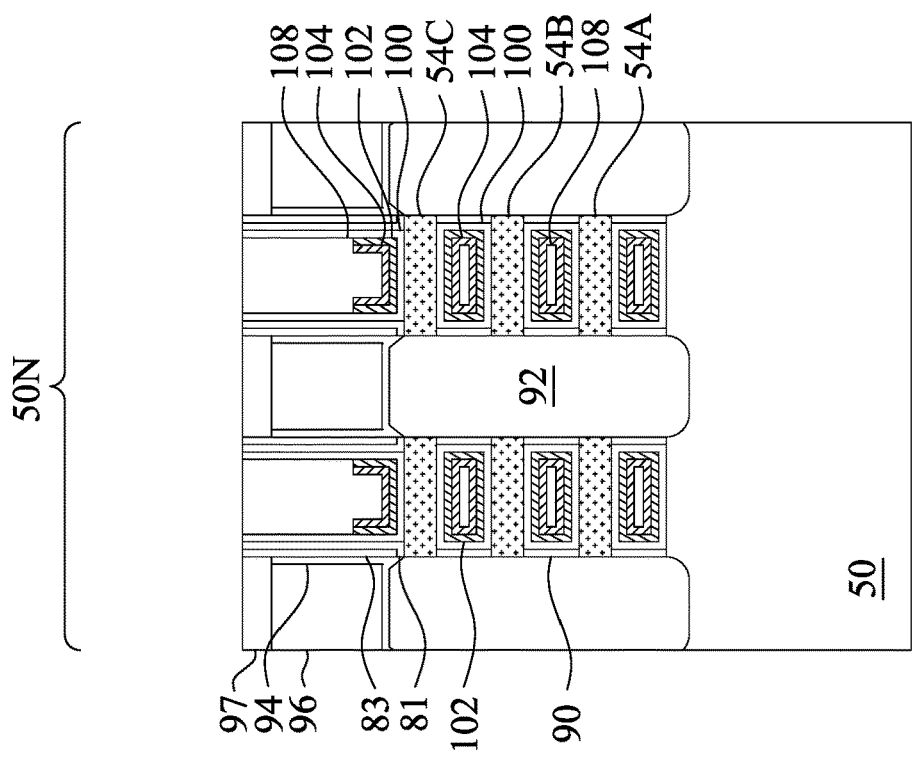
Figure 21A:
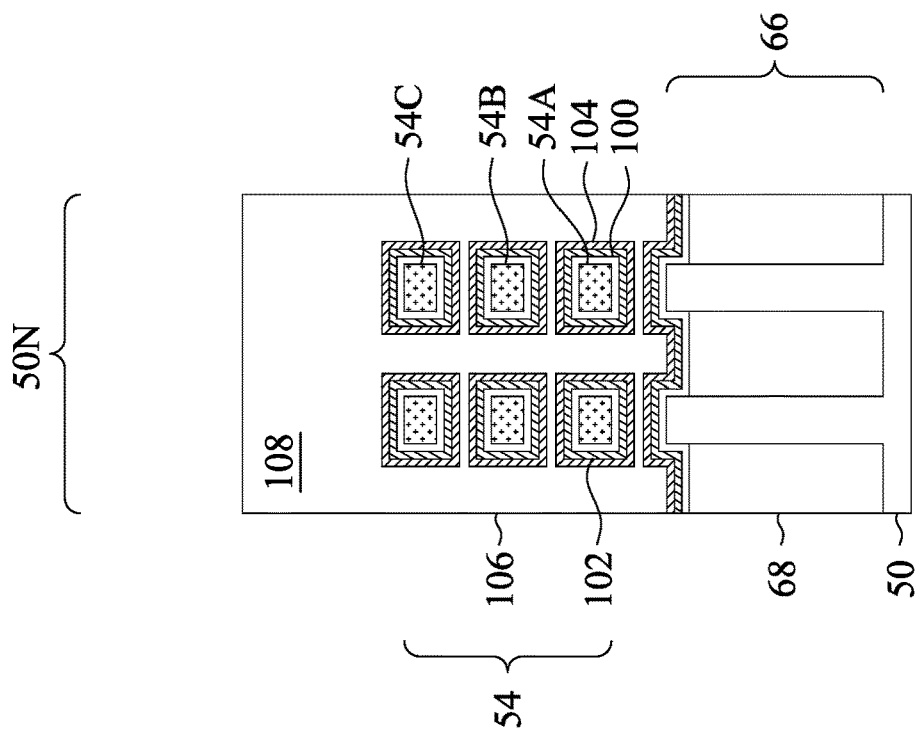
Figure 21D:
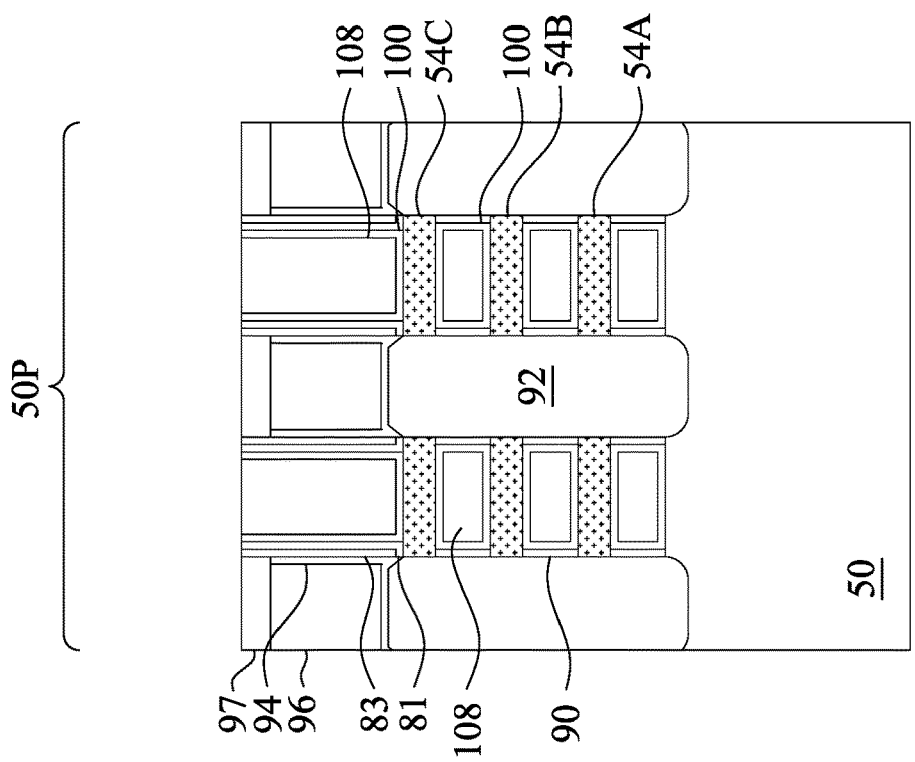
Figure 21C:
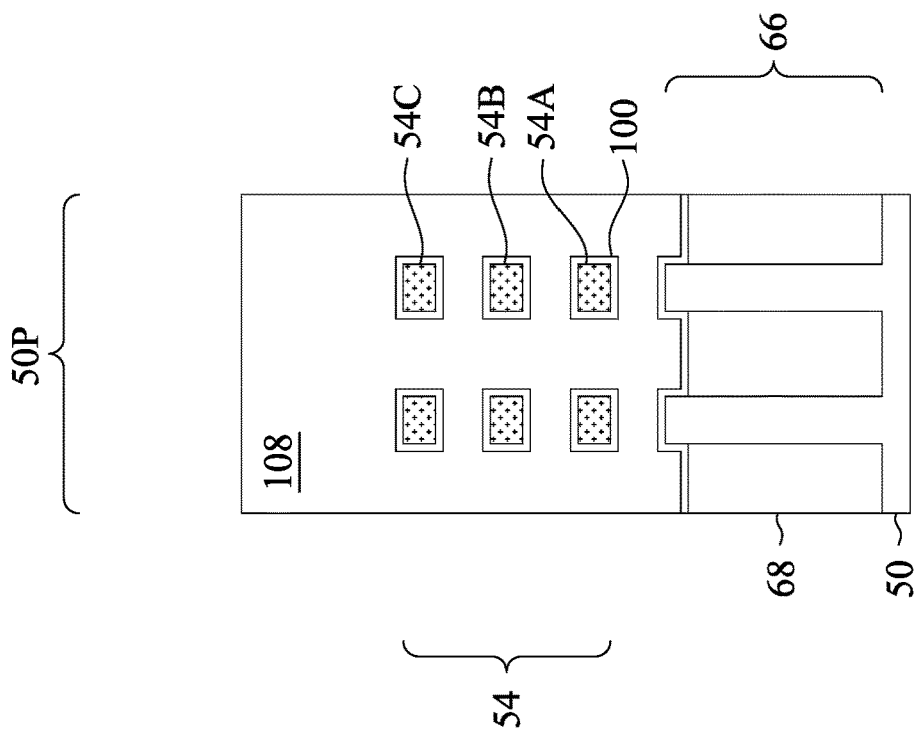

In FIGS. 21A and 21B, the first mask layer 106 is removed and a second conductive material 108 is formed over the anti-reaction layers 104, the first conductive material 102, and the gate dielectric layers 100 in the n-type region 50N. In FIGS. 21C and 21D, the second conductive material 108 is formed over the gate dielectric layers 100 in the p-type region 50P. FIGS. 21A and 21B illustrate the n-type region 50N and FIGS. 21C and 21D illustrate the p-type region 50P. The first mask layer 106 may be removed by plasma ashing, an etching process such as an isotropic or an anisotropic etching process, or the like.

The second conductive material 108 may fill the second recesses 98 and extend over the gate dielectric layers 100 on the protection layer 97. The second conductive material 108 may be deposited conformally by a process such as ALD, CVD, PVD, or the like. In some embodiments, the second conductive material 108 is a p-type work function layer, which may comprise W, Cu, TiN, Ti, Pt, Ta, TaN, Co, Ni, TaC, TaCN, TaSiN, $TaSi_2$, $NiSi_2$, Mn, Zr, $ZrSi_2$, TaN, Ru, Mo, $MoSi_2$, WN, WCN, other metal oxides, metal nitrides, metal silicates, transition metal-oxides, transition metal-nitrides, transition metal-silicates, oxynitrides of metals, metal aluminates, zirconium silicate, zirconium aluminate, other suitable n-type work function materials, combinations thereof, or the like. After the filling of the second recesses 98, a planarization process, such as a CMP, may be performed to remove the excess portions of the second conductive material 108, which excess portions are over the top surface of the protection layer 97, the first spacers 81, and the second spacers 83. Bottom surfaces of the second conductive material 108 in the p-type region 50P may be level with bottom surfaces of the first conductive material 102 in the n-type region 50N and below bottom surfaces of the second conductive material 108 in the n-type region 50N.

As illustrated in FIGS. 21A and 21B, the second conductive material 108 may be deposited on top surfaces of the first conductive material 102 and the anti-reaction layers 104. The second conductive material 108 may cover the anti-reaction layers 104. Subsequently, a conductive cap material may be selectively deposited over the second conductive material 108. Because the anti-reaction layers 104 are formed of a dielectric material, the anti-reaction layers 104 may impede the selective deposition of the conductive cap material. Forming the second conductive material 108 over the anti-reaction layers 104 aids in the subsequent deposition of the conductive cap material, which is used to reduce gate resistance, while providing the anti-reaction layers 104, which boost threshold voltage. This improves device performance.

In some embodiments, a glue layer (not separately illustrated) may be deposited over the anti-reaction layers 104, the first conductive material 102, and the gate dielectric layers 100 in the n-type region 50N and over the gate dielectric layers 100 in the p-type region 50P prior to forming the second conductive material 108 to improve adhesion between the second conductive material 108 and the underlying structures. The glue layer may further prevent diffusion between the second conductive material 108 and the underlying structures. The glue layer may include any acceptable material to promote adhesion and prevent diffusion. For example, the glue layer may be formed of a metal or metal nitride such as titanium nitride, titanium aluminide, titanium aluminum nitride, silicon-doped titanium nitride, tantalum nitride, or the like, which may be deposited by ALD, CVD, PVD, or the like.

Figure 22B:
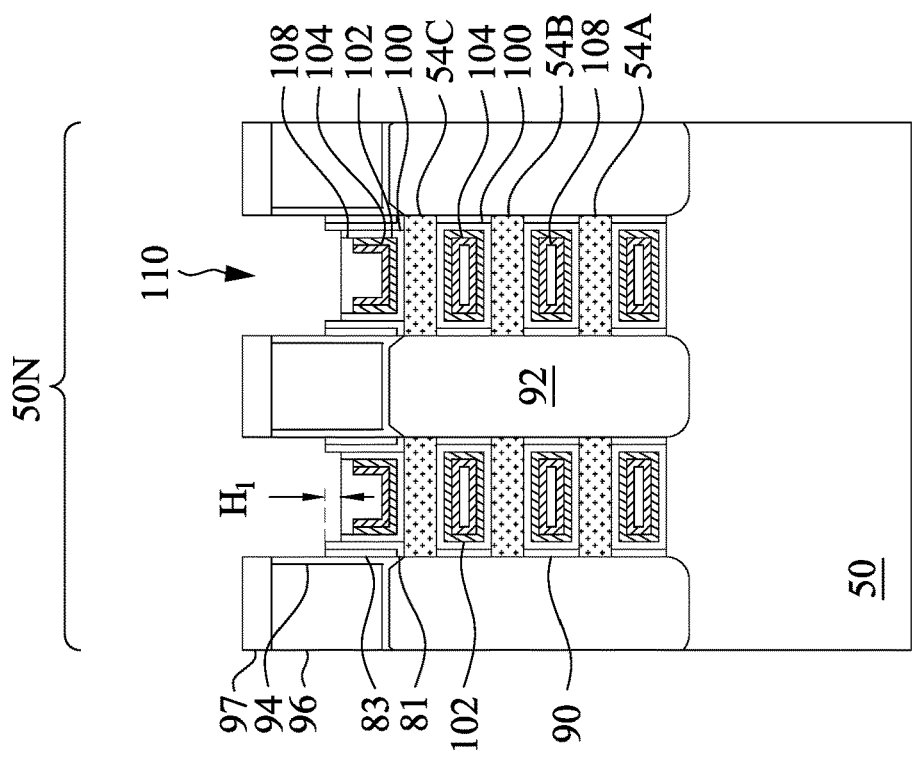
Figure 22A:
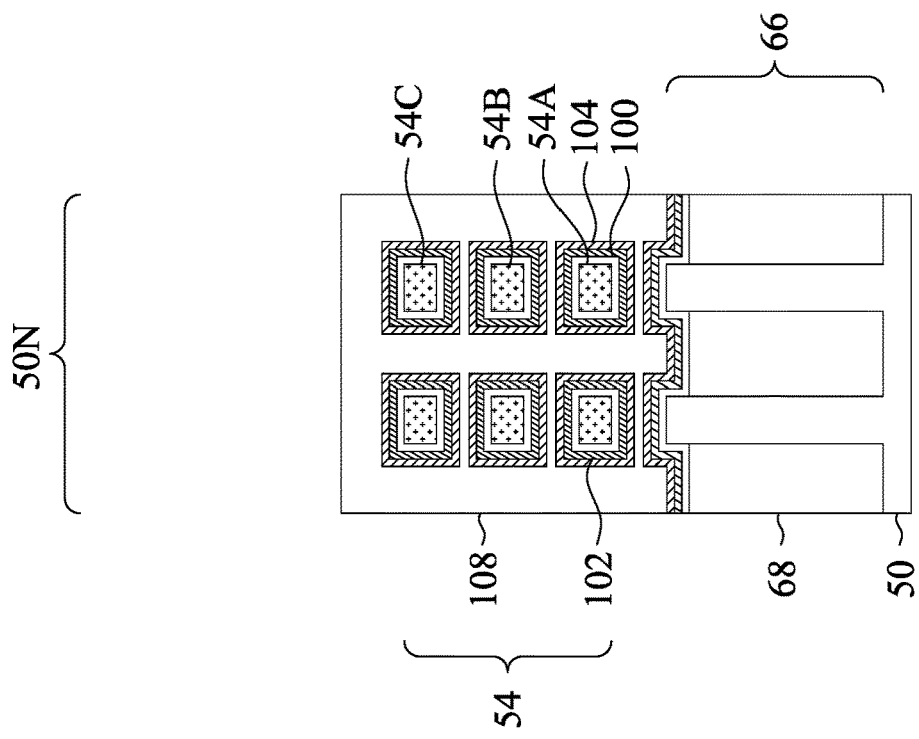
Figure 22D:
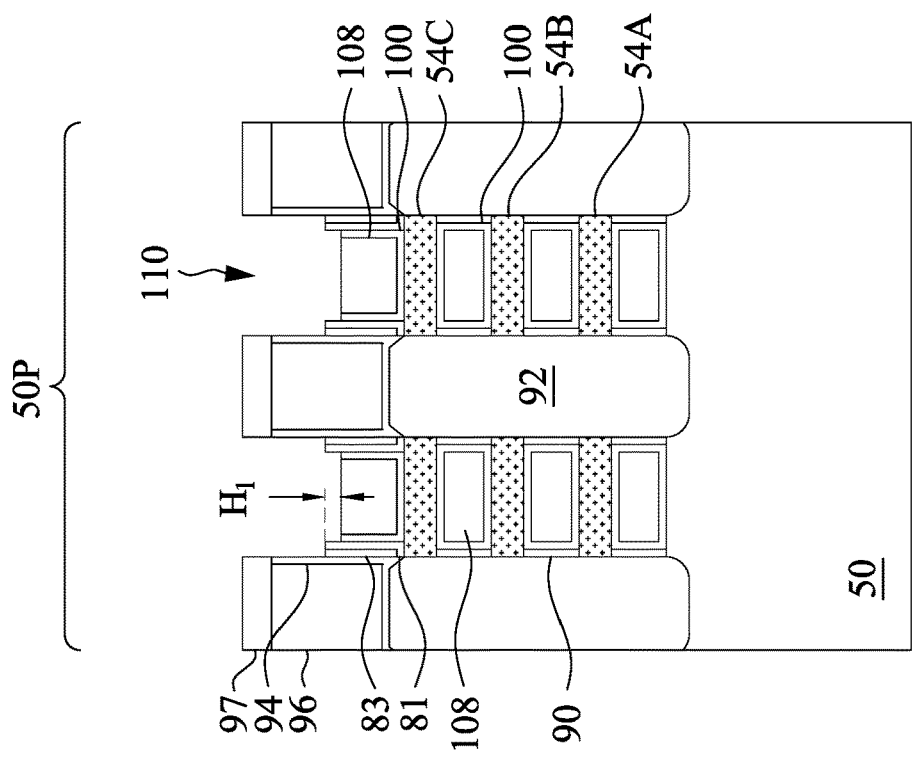
Figure 22C:
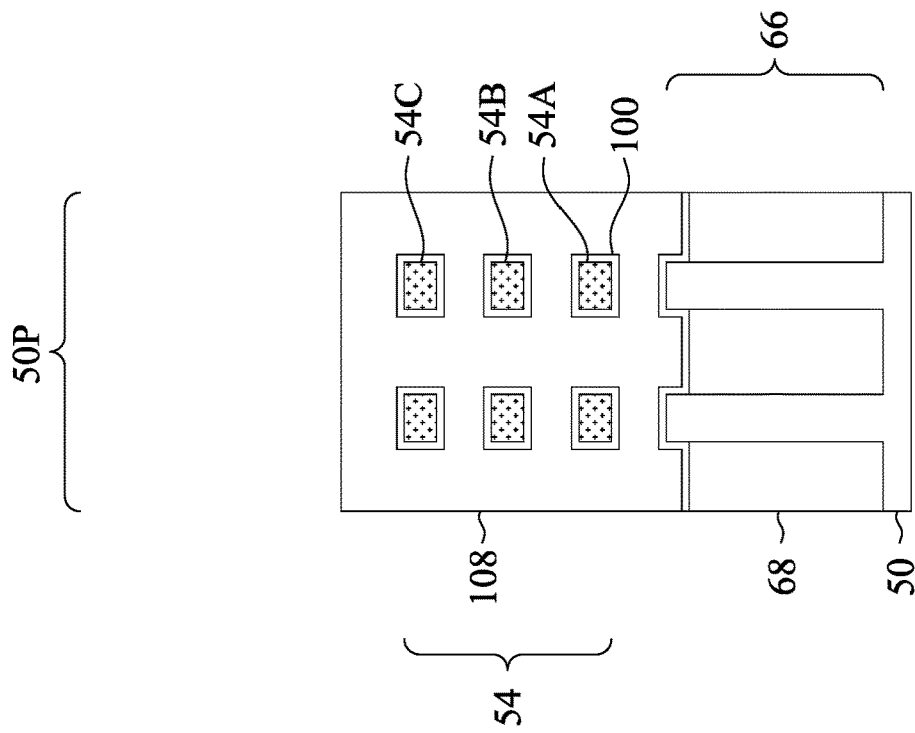
Figure 22E:
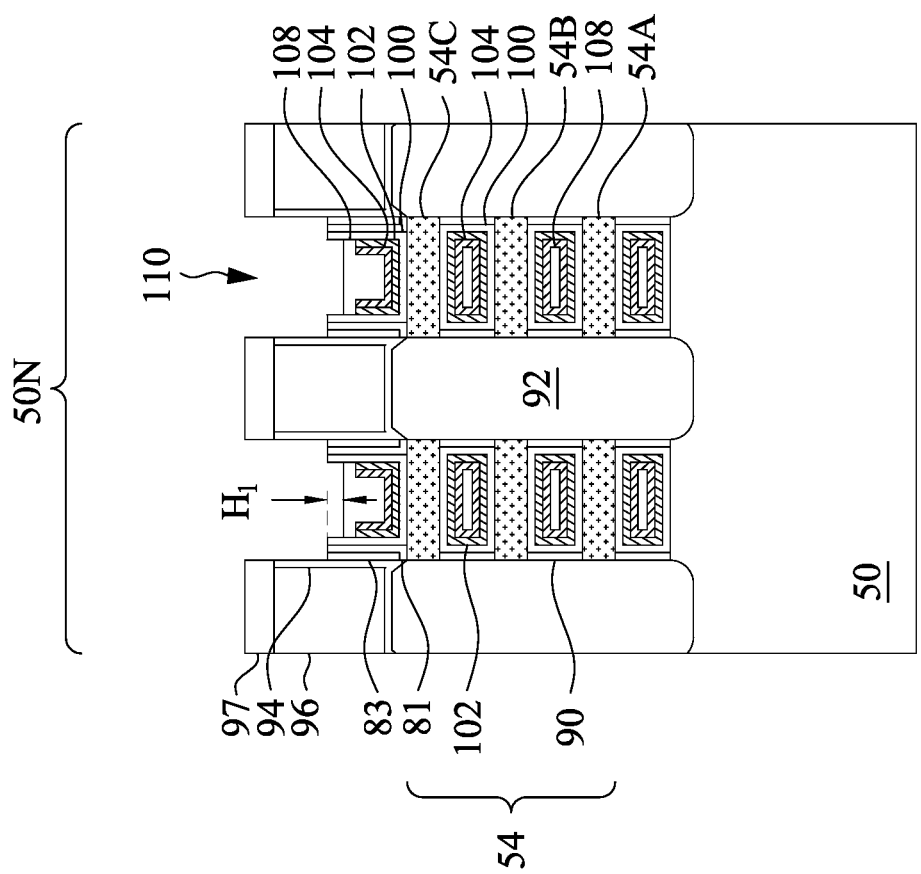

In FIGS. 22A through 22E, the first spacers 81, the second spacers 83, the gate dielectric layers 100, and the second conductive material 108 are etched back to form third recesses 110. FIGS. 22A, 22B, and 22E illustrate the n-type region 50N according to various embodiments and FIGS. 22C and 22D illustrate the p-type region 50P. The first spacers 81, the second spacers 83, the gate dielectric layers 100, and the second conductive material 108 may be etched using suitable etching processes, such as isotropic etching processes (e.g., wet etching processes), anisotropic etching processes (e.g., dry etching processes), or the like. In some embodiments, the first spacers 81, the second spacers 83, the gate dielectric layers 100, and the second conductive material 108 may be etched by multiple selective etching processes in order to control the heights of each of the first spacers 81, the second spacers 83, the gate dielectric layers 100, and the second conductive material 108. In the embodiments illustrated in FIGS. 22A through 22E, top surfaces of the second conductive material 108 in the n-type region 50N may be level with top surfaces of the second conductive material 108 in the p-type region 50P. Heights of the second conductive material 108 in the p-type region 50P may be equal to combined heights of the first conductive material 102, the anti-reaction layers 104, and the second conductive material 108 in the n-type region 50N.

As illustrated in FIGS. 22A through 22D, the first spacers 81, the second spacers 83, the gate dielectric layers 100, and the second conductive material 108 may be etched such that top surfaces of the first spacers 81 and the second spacers 83 are level with one another and disposed above top surfaces of the gate dielectric layers 100 and the second conductive material 108, which are level with one another. The second conductive material 108 may be T-shaped in the cross-sectional view illustrated in FIG. 22B. As illustrated in FIG. 22E, the first spacers 81, the second spacers 83, the gate dielectric layers 100, and the second conductive material 108 may be etched such that top surfaces of the first spacers 81, the second spacers 83, and the gate dielectric layers 100 are level with one another and disposed above top surfaces of the second conductive material 108. The top surfaces of the first spacers 81, the second spacers 83, and/or the gate dielectric layers 100 may be disposed above the top surfaces of the second conductive material 108 and/or the gate dielectric layers 100 a height $H_1$ ranging from about 0 nm to about 10 nm. The height $H_1$ may be used to control the thickness of a subsequently formed conductive cap material, which may be used to reduce gate resistance and improve device performance.

Figure 23B:
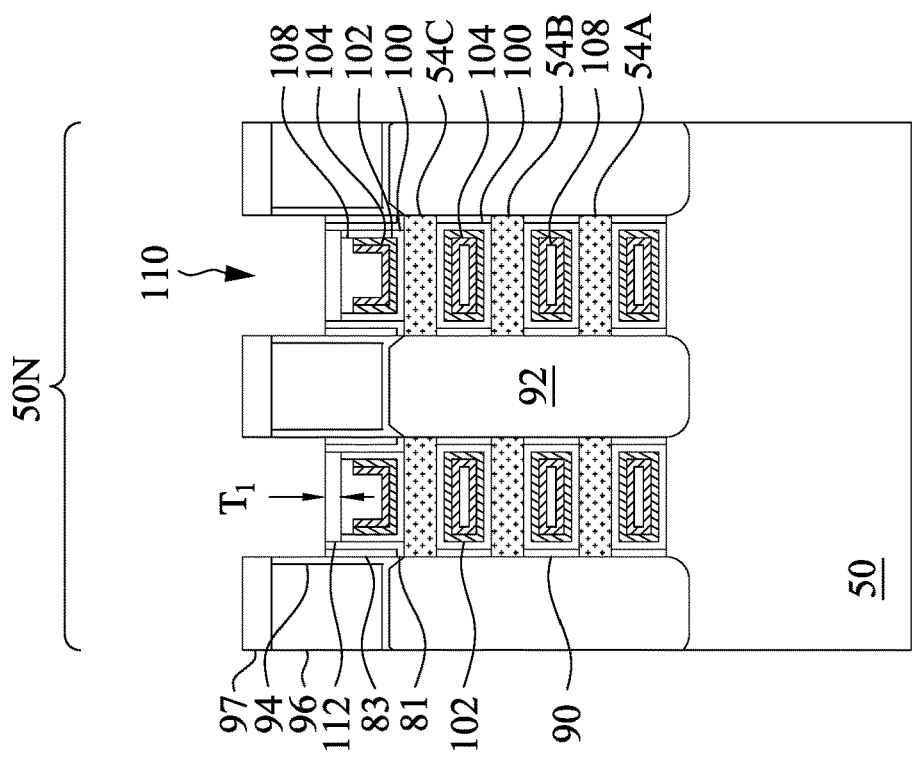
Figure 23A:
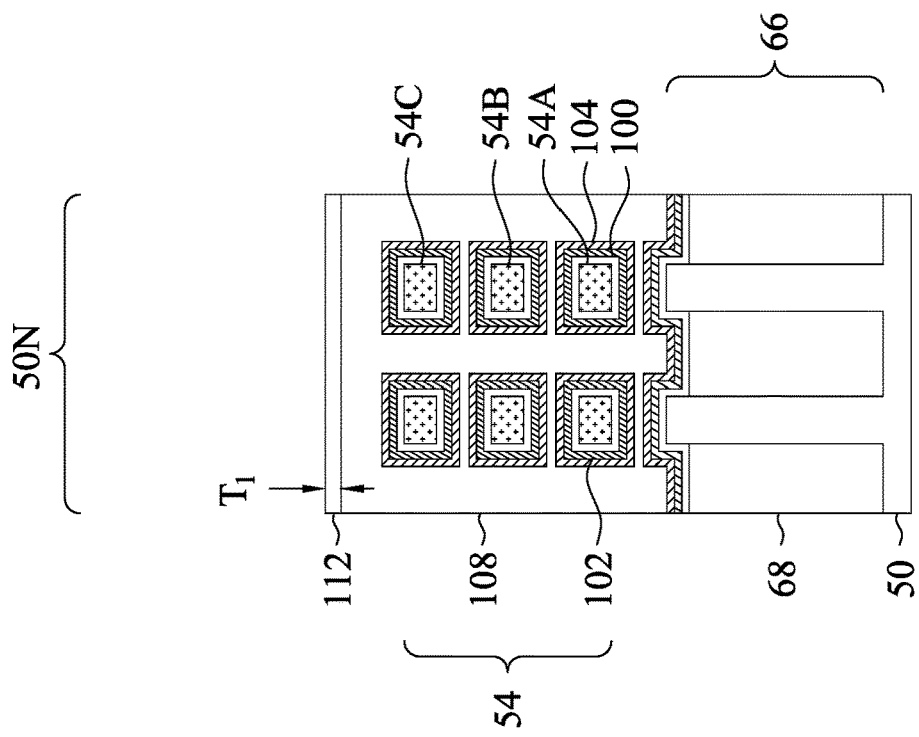
Figure 23D:
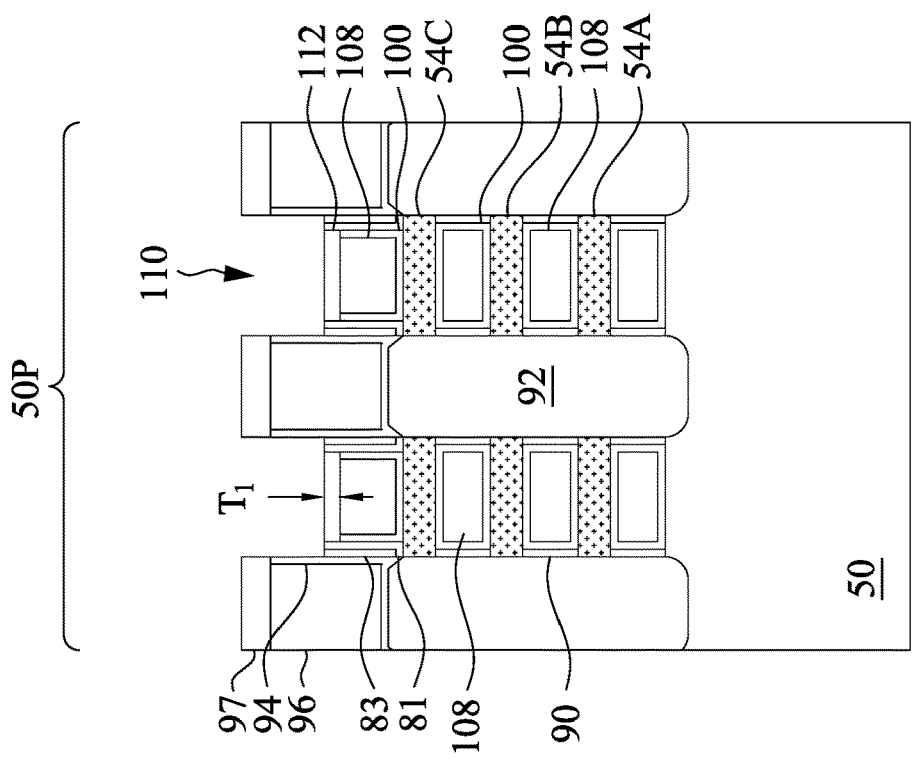
Figure 23C:
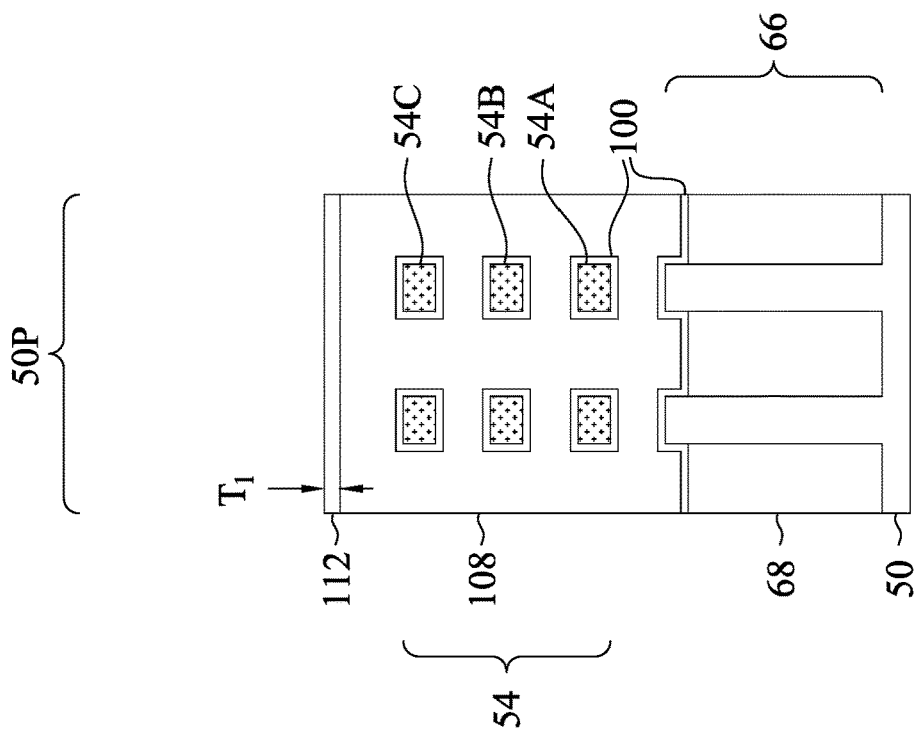
Figure 23F:
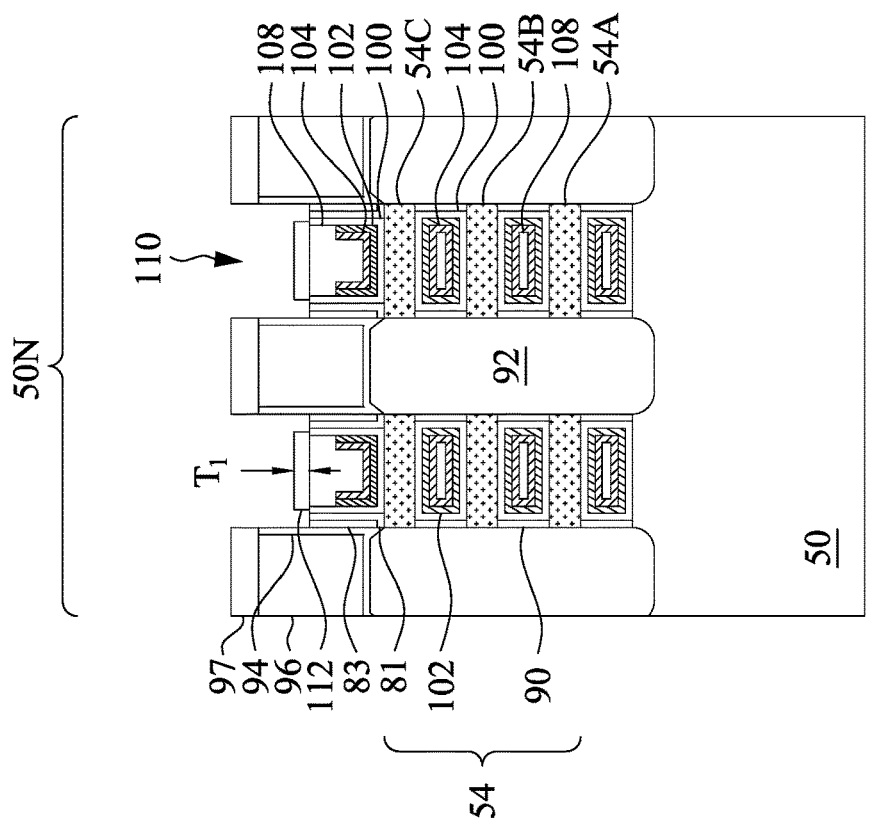
Figure 23E:
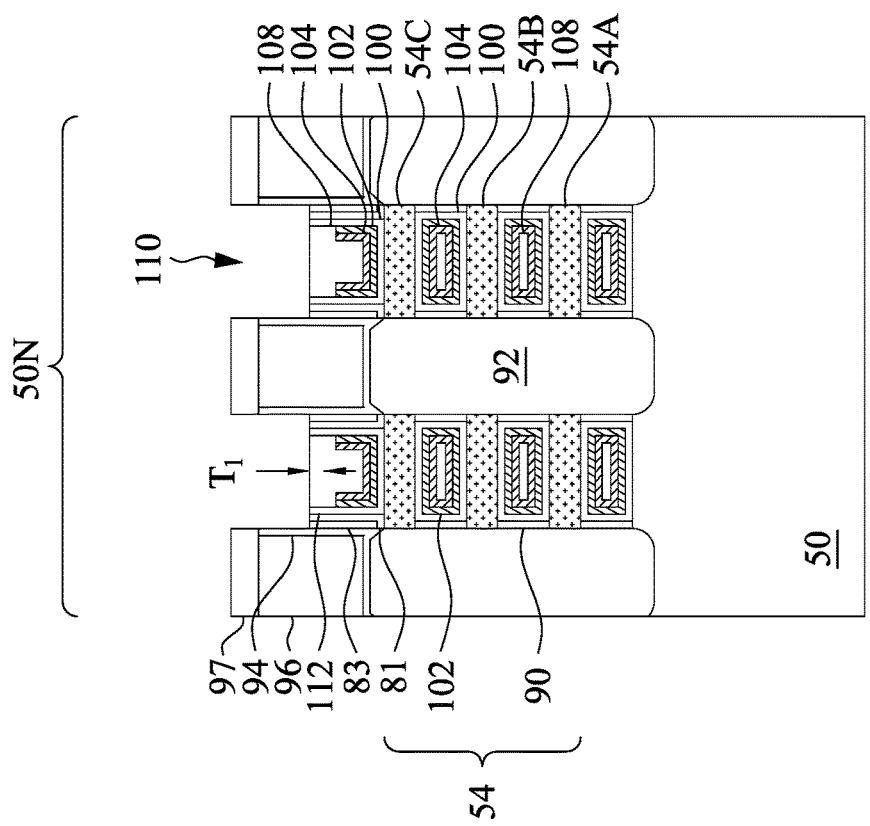

In FIGS. 23A through 23H, a conductive cap material 112 is formed in the third recesses 110 over the second conductive material 108. FIGS. 23A, 23B, and 23E through 23H illustrate the n-type region 50N according to various embodiments and FIGS. 23C and 23D illustrate the p-type region 50P. The conductive cap material 112 may be formed by a selective deposition process. For example, the conductive cap material 112 may be selectively deposited on the second conductive material 108 using a process such as ALD or the like. In some embodiments, the second conductive material 108 may also extend over top surfaces of the gate dielectric layers 100. In some embodiments, the conductive cap material 112 may comprise a conductive material, such as tungsten (W), cobalt (Co), ruthenium (Ru), or the like.

As illustrated in FIGS. 23A and 23B, the conductive cap material 112 may be deposited over the second conductive material 108, with the second conductive material 108 separating the conductive cap material 112 from the anti-reaction layers 104. Because the anti-reaction layers 104 are formed of a dielectric material, the anti-reaction layers 104 may impede the selective deposition of the conductive cap material 112. As such, the second conductive material 108 is deposited over the anti-reaction layers 104 to cover the anti-reaction layers 104. This aids in the deposition of the conductive cap material 112, which reduces device defects caused by depositing the conductive cap material 112 and reduces costs.

In embodiments in which the conductive cap material 112 comprises tungsten, the conductive cap material 112 may be deposited using a tungsten chloride ($WCl_5$) precursor, a hydrogen ($H_2$) reducing gas, and an argon (Ar) carrier gas at a temperature ranging from about 300° C. to about 500° C. and a process pressure ranging from about 10 Torr to about 50 Torr. The tungsten chloride precursor may be supplied at a temperature ranging from about 100° C. to about 150° C. The conductive cap material 112 may be deposited to a thickness $T_1$ ranging from about 2 nm to about 5 nm. In some embodiments, the conductive cap material 112 may further comprise chlorine having an atomic concentration ranging from about 0.5% to about 5%. The gate dielectric layers 100, the first conductive material 102, the anti-reaction layers 104, the second conductive material 108, and the conductive cap material 112 in the n-type region 50N and the gate dielectric layers 100, the second conductive material 108, and the conductive cap material 112 in the p-type region 50P may be collectively referred to as "gate structures." The first conductive material 102, the anti-reaction layers 104, the second conductive material 108, and the conductive cap material 112 in the n-type region 50N and the second conductive material 108, and the conductive cap material 112 in the p-type region 50P may be collectively referred to as "gate electrodes." Including the conductive cap material 112 having the prescribed thickness may reduce the resistance of the gate structures, which improves device performance.

As illustrated in FIGS. 23A through 23D, the conductive cap material 112 may extend along top surfaces of the gate dielectric layers 100 and the second conductive material 108 between opposite side surfaces of the second spacers 83. Top surfaces of the conductive cap material in the n-type region 50N and the p-type region 50P may be level with one another and with top surfaces of the first spacers 81 and the second spacers 83. In the embodiment illustrated in FIG. 23E, top surfaces of the gate dielectric layers 100 are level with top surfaces of the second spacers 83 and the first spacers 81 and above top surfaces of the second conductive material 108. The conductive cap material 112 extends along top surfaces of the second conductive material 108 between opposite side surfaces of the gate dielectric layers 100. In the embodiment illustrated in FIG. 23F, top surfaces of the second conductive material 108 and the gate dielectric layers 100 are level with top surfaces of the second spacers 83 and the first spacers 81. The conductive cap material 112 may extend along top surfaces of the second conductive material 108 and the gate dielectric layers 100 and the top surfaces of the second spacers 83 and the first spacers 81 may be free from the conductive cap material 112. In some embodiments, the conductive cap material 112 may also extend along the top surfaces of the second spacers 83 and the first spacers 81 between opposite side surfaces of the CESL 94.

Figure 23H:
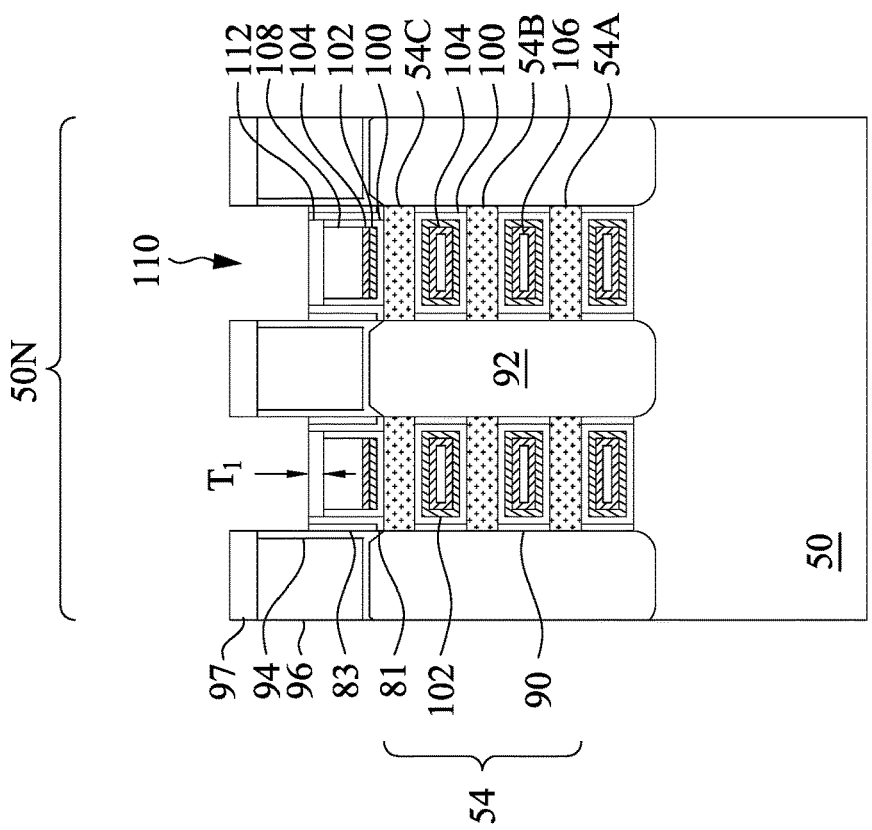
Figure 23G:
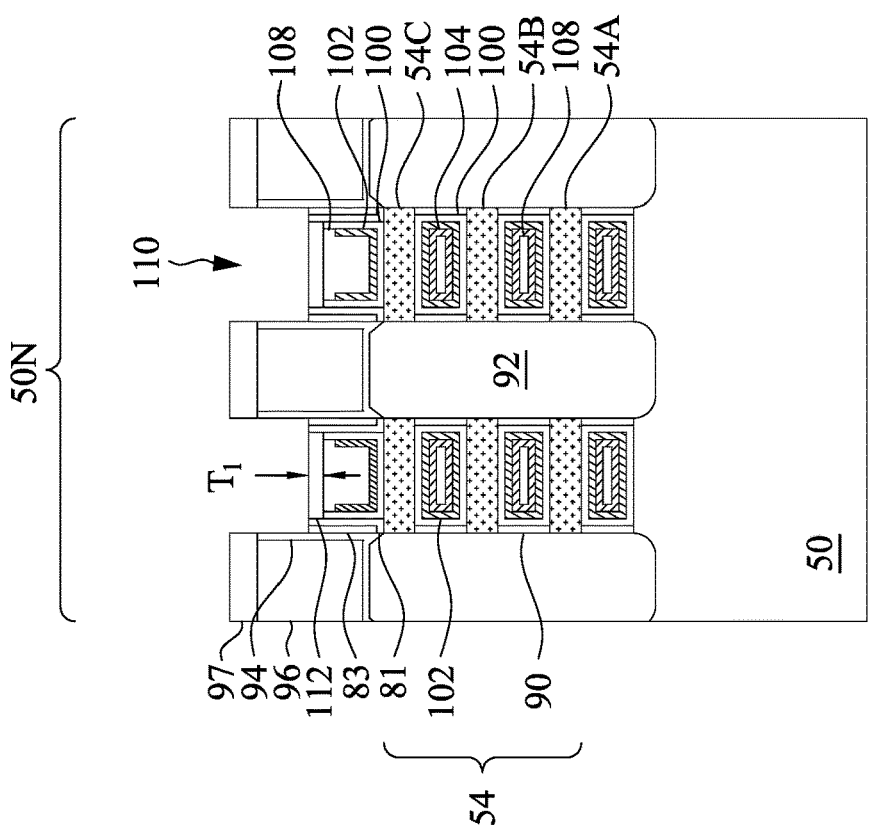

In the embodiment illustrated in FIG. 23G, the anti-reaction layers 104 are omitted. The anti-reaction layers 104 may be omitted in embodiments in which the first conductive material 102 is of a sufficient thickness, the first conductive material 102 is formed of a material having a relatively low oxidation potential, or the threshold voltage without the anti-reaction layers 104 is otherwise sufficiently great. FIG. 23H illustrates the embodiment of FIGS. 20C and 20D, wherein the anti-reaction layers 104 and the first conductive material 102 are straight lines extending between opposite side surfaces of the second spacers 83. As illustrated in FIG. 23H, the first conductive material 102, the anti-reaction layers 104, and the second conductive material 108 may have widths equal to one another. In the embodiments of FIGS. 23G and 23H, the conductive cap material 112 may extend along top surfaces of the gate dielectric layers 100 and the second conductive material 108 between opposite side surfaces of the second spacers 83.

Figure 24B:
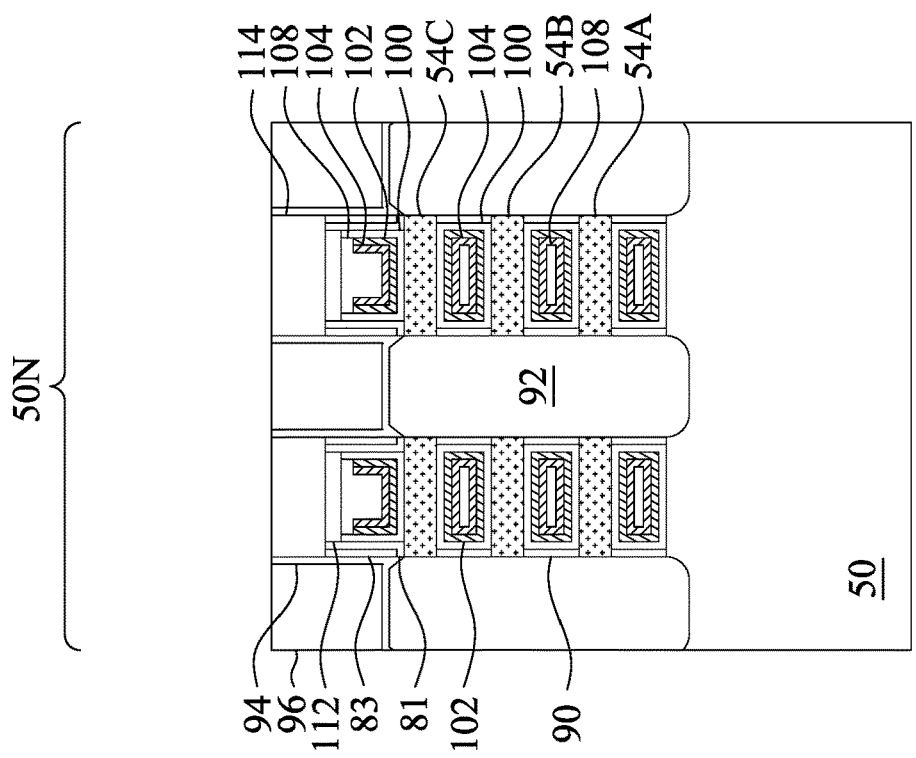
Figure 24A:
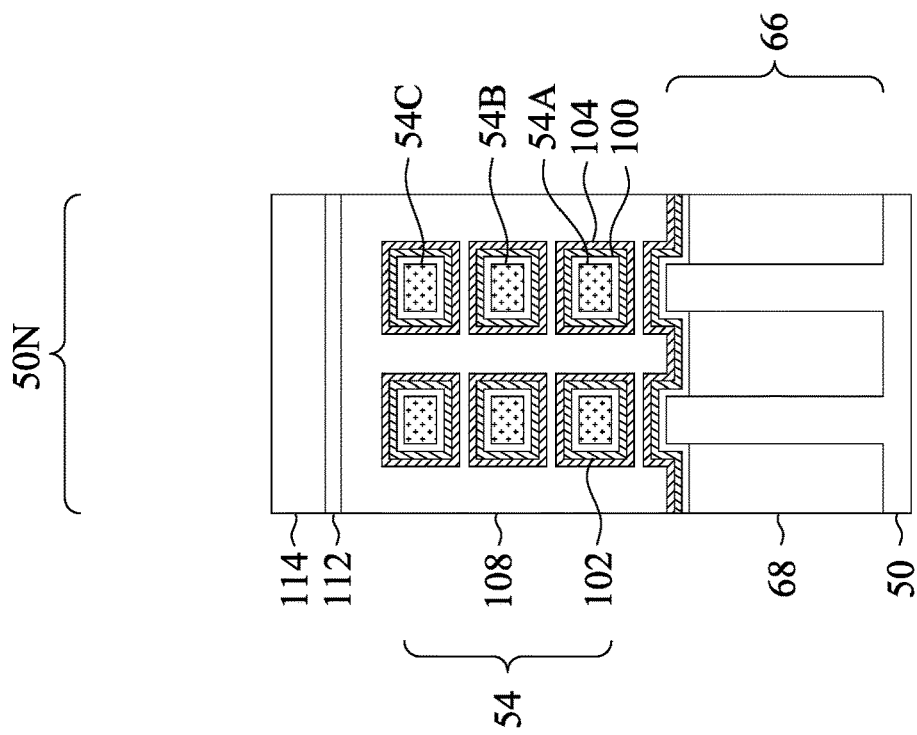

In FIGS. 24A and 24B, a second ILD 114 is deposited over the protection layer 97, the first spacers 81, the second spacers 83, the CESL 94, and the conductive cap material 112 filling the third recesses 110. FIGS. 24A and 24B illustrate the n-type region 50N; however, the second ILD 114 may also be formed over the p-type region 50P. In some embodiments, the second ILD 114 is a flowable film formed by FCVD. In some embodiments, the second ILD 114 is formed of a dielectric material such as PSG, BSG, BPSG, USG, or the like, and may be deposited by any suitable method, such as CVD, PECVD, or the like. After the second ILD 114 is deposited, the second ILD 114 is planarized and the protection layer 97 is removed. The second ILD 114 may be planarized by a process such as CMP. Portions of the second ILD 114 disposed above the first ILD 96 and the CESL 94 may be removed and, following the planarization, top surfaces of the first ILD 96 and the CESL 94 may be level with top surfaces of the second ILD 114. The planarization process may further remove the protection layer 97.

Figure 25B:
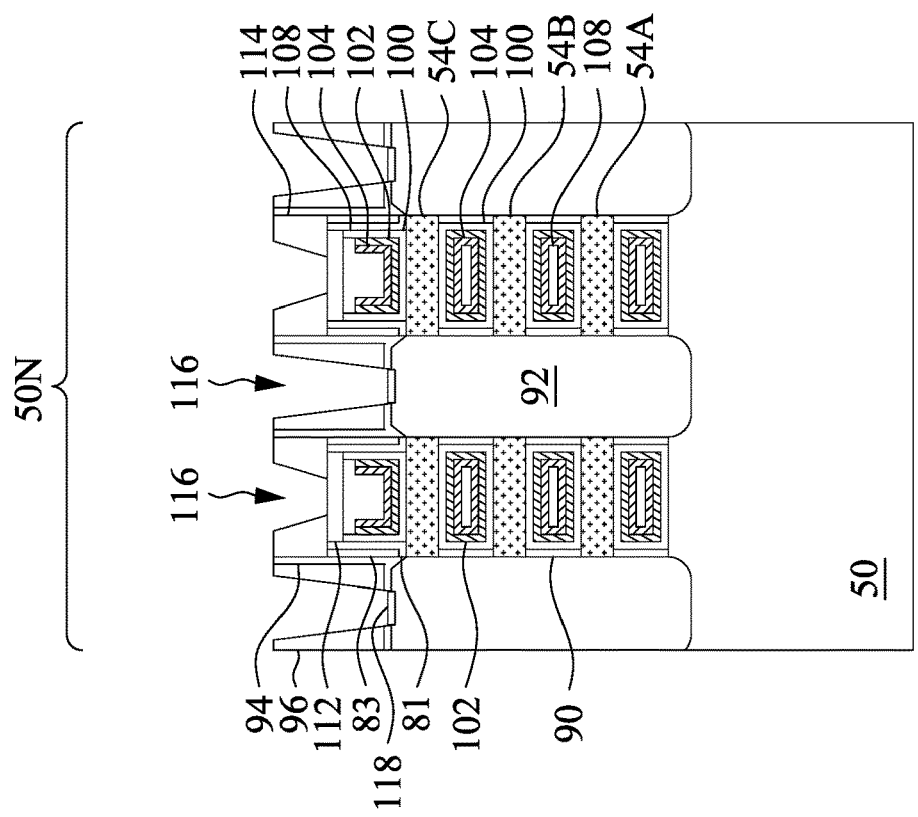
Figure 25A:
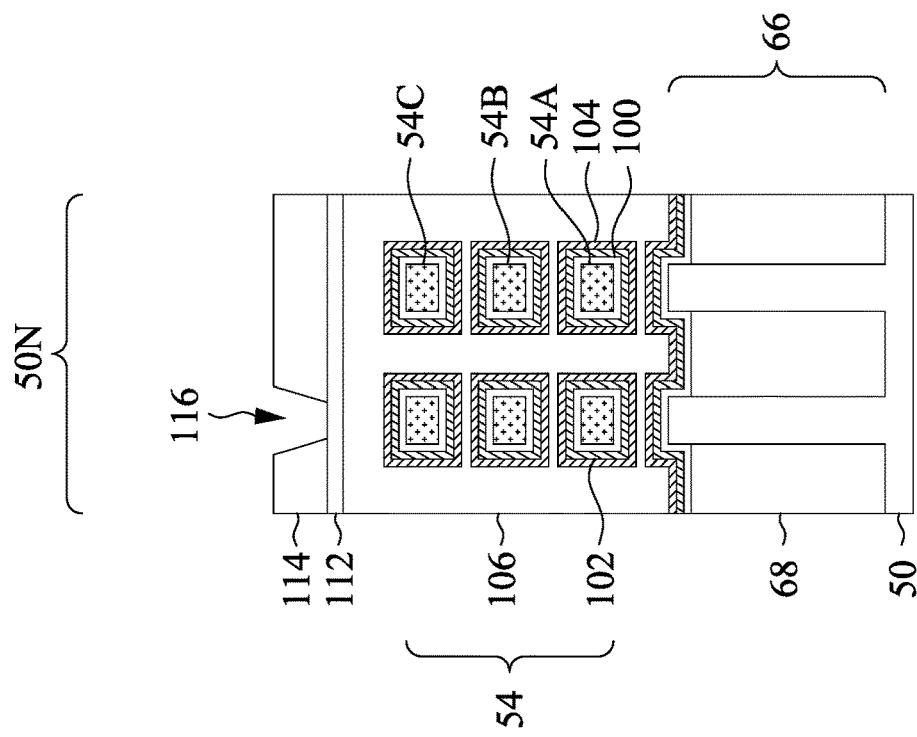

In FIGS. 25A and 25B, the second ILD 114, the first ILD 96, and the CESL 94 are etched to form fourth recesses 116 exposing surfaces of the epitaxial source/drain regions 92 and/or the conductive cap material 112. FIGS. 25A and 25B illustrate the n-type region 50N; however, the fourth recesses 116 may also be formed in the p-type region 50P. The fourth recesses 116 may be formed by etching using an anisotropic etching process, such as RIE, NBE, or the like. In some embodiments, the fourth recesses 116 may be etched through the second ILD 114 and the first ILD 96 using a first etching process and may then be etched through the CESL 94 using a second etching process. A mask, such as a photoresist, may be formed and patterned over the first ILD 96, the CESL 94, and the second ILD 114 to mask portions of the first ILD 96, the CESL 94, and the second ILD 114 from the first etching process and the second etching process. In some embodiments, the etching process may over-etch, and therefore, the fourth recesses 116 extend into the epitaxial source/drain regions 92 and/or the conductive cap material 112, and a bottom of the fourth recesses 116 may be level with (e.g., at a same level, or having a same distance from the substrate 50), or lower than (e.g., closer to the substrate 50) the epitaxial source/drain regions 92 and/or the conductive cap material 112. Although FIG. 25B illustrates the fourth recesses 116 as exposing the epitaxial source/drain regions 92 and the gate structures in a same cross-section, in some embodiments, the epitaxial source/drain regions 92 and the gate structures may be exposed in different cross-sections, thereby reducing the risk of shorting subsequently formed contacts. After the fourth recesses 116 are formed, silicide regions 118 are formed over the epitaxial source/drain regions 92. In some embodiments, the silicide regions 118 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 118. The un-reacted portions of the deposited metal are then removed, e.g., by an etching process. Although silicide regions 118 are referred to as silicide regions, silicide regions 118 may also be germanide regions, or silicon germanide regions (e.g., regions comprising silicide and germanide). In an embodiment, the silicide regions 118 comprise TiSi, and have thicknesses ranging from about 2 nm to about 10 nm.

Figure 26B:
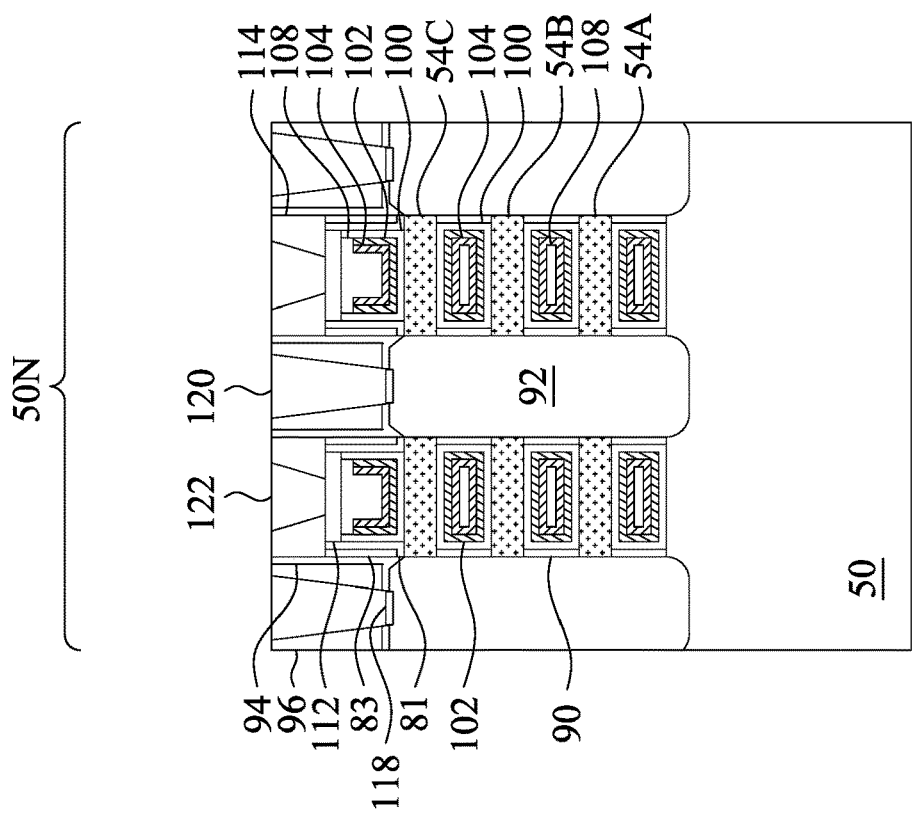
Figure 26A:
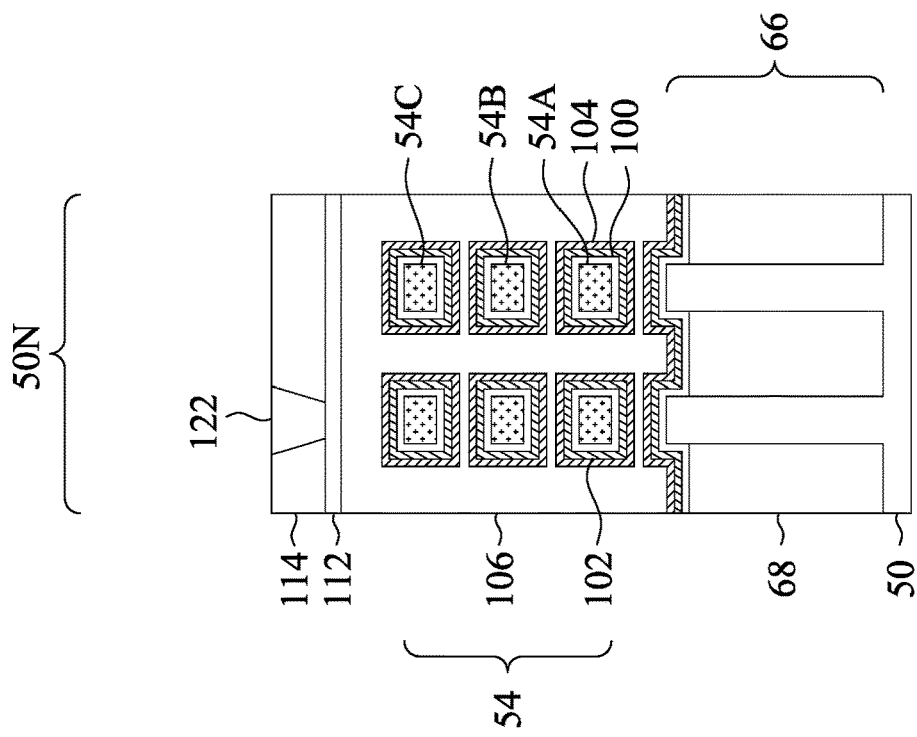

In FIGS. 26A and 26B, source/drain contacts 120 and gate contacts 122 are formed in the fourth recesses 116. FIGS. 26A and 26B illustrate the n-type region 50N; however, the source/drain contacts 120 and gate contacts 122 may also be formed in the p-type region 50P. The source/drain contacts 120 and the gate contacts 122 may each comprise one or more layers, such as barrier layers, diffusion layers, and fill materials. For example, in some embodiments, the source/drain contacts 120 and the gate contacts 122 each include a barrier layer and a conductive material over the barrier layer. The source/drain contacts 120 and the gate contacts 122 are each electrically coupled to underlying conductive features (e.g., the conductive cap material 112 and/or the silicide regions 118). The gate contacts 122 are electrically coupled to the conductive cap material 112 of the gate structures, and the source/drain contacts 120 are electrically coupled to the silicide regions 118 over the epitaxial source/drain regions 92. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the CESL 94, the first ILD 96, and the second ILD 114 such that top surfaces of the source/drain contacts 120 and the gate contacts 122 are level with top surfaces of the CESL 94, the first ILD 96, and the second ILD 114.

Embodiments may achieve advantages. For example, the anti-reaction layer 104 may be included over the first conductive material 102 to prevent oxidation of the first conductive material 102 and boost the threshold voltage of devices including the anti-reaction layer 104. The second conductive material 108 may then cover surfaces of the anti-reaction layer 104, providing a material on which the conductive cap material 112 may be selectively deposited. The conductive cap material 112 may then be used to reduce gate resistance. The increased threshold voltage and reduced gate resistance may improve performance of semiconductor devices including the same anti-reaction layer 104 and/or the conductive cap material 112.

In accordance with an embodiment, a semiconductor device includes a gate structure over a semiconductor substrate, the gate structure including a high-k dielectric layer; an n-type work function layer over the high-k dielectric layer; an anti-reaction layer over the n-type work function layer, the anti-reaction layer including a dielectric material; a p-type work function layer over the anti-reaction layer, the p-type work function layer covering top surfaces of the anti-reaction layer; and a conductive cap layer over the p-type work function layer. In an embodiment, the p-type work function layer is T-shaped in a cross-sectional view. In an embodiment, the anti-reaction layer includes silicon. In an embodiment, the conductive cap layer includes tungsten. In an embodiment, top surfaces of the high-k dielectric layer are level with a top surface of the p-type work function layer. In an embodiment, the semiconductor device further includes gate spacers adjacent the gate structure, the conductive cap layer extends between opposite side surfaces of the gate spacers, and top surfaces of the gate spacer are level with a top surface of the conductive cap layer. In an embodiment, the semiconductor device further includes gate spacers adjacent the gate structure, a top surface of the p-type work function layer being level with top surfaces of the high-k dielectric layer and top surfaces of the gate spacers.

In accordance with another embodiment, a semiconductor device includes a first channel region in an n-type region; a second channel region in a p-type region; a first gate stack over the first channel region, the first gate stack including a first gate dielectric layer over the first channel region; an n-type metal layer over and in contact with the first gate dielectric layer, the n-type metal layer including aluminum; a dielectric layer over the n-type metal layer; a first p-type metal layer over the n-type metal layer and the dielectric layer; and a first metal cap layer over the first p-type metal layer; and a second gate stack over the second channel region, the second gate stack including a second gate dielectric layer over the second channel region; a second p-type metal layer over and in contact with the second gate dielectric layer; and a second metal cap layer over the second p-type metal layer. In an embodiment, a combined height of the n-type metal layer, the dielectric layer, and the first p-type metal layer is equal to a height of the second p-type metal layer. In an embodiment, the dielectric layer and the first p-type metal layer are in contact with the first gate dielectric layer. In an embodiment, the dielectric layer includes silicon. In an embodiment, the first metal cap layer and the second metal cap layer include chlorine. In an embodiment, a top surface of the first p-type metal layer is level with a top surface of the second p-type metal layer, and a bottom surface of the second p-type metal layer is below a bottom surface of the first p-type metal layer. In an embodiment, the semiconductor device further includes a first gate spacer extending along a sidewall of the first gate stack; and a second gate spacer extending along a sidewall of the second gate stack, a top surface of the second gate spacer being level with a top surface of the second metal cap layer, a top surface of the first gate spacer, and a top surface of the first metal cap layer.

In accordance with yet another embodiment, a method includes forming a gate stack over a semiconductor substrate, forming the gate stack including depositing an n-type work function layer over the semiconductor substrate; depositing a dielectric layer over the n-type work function layer; forming a first mask layer over the dielectric layer; etching back the n-type work function layer and the dielectric layer; depositing a p-type work function layer over the n-type work function layer and the dielectric layer; and selectively depositing a metal cap layer over the p-type work function layer. In an embodiment, the metal cap layer is deposited by atomic layer deposition using tungsten chloride as a precursor. In an embodiment, the n-type work function layer and the dielectric layer are etched back using the first mask layer as a mask, and the first mask layer is removed before depositing the p-type work function layer. In an embodiment, the method further includes etching back the dielectric layer to expose the n-type work function layer, the p-type work function layer being deposited in contact with the n-type work function layer and the dielectric layer. In an embodiment, the method further includes forming a gate spacer adjacent a sacrificial gate stack; removing the sacrificial gate stack to form a first opening, the gate stack being formed in the first opening; planarizing the gate spacer and the p-type work function layer; and etching back the p-type work function layer after planarizing the gate spacer and the p-type work function layer. In an embodiment, the method further includes etching back the gate spacer, the metal cap layer being deposited between opposite side surfaces of the gate spacer.

Some embodiments disclosed herein provide for a method of forming a nanoFET that includes forming on a substrate a multi-layer stack of alternating layers of first and second semiconductor material. The method also includes removing the alternating layers of first semiconductor material and patterning the layers of second semiconductor material to form respective channel regions in the second semiconductor material separated by respective gaps, and forming a recess above a topmost channel region of the respective channel regions. The method also includes forming a gate structure in the respective gaps and between the respective channel regions, by conformally depositing a gate dielectric layer on respective channel regions, and in the recess, conformally depositing a first conductor layer on the gate dielectric layer, and conformally depositing an anti-reaction layer on the first conductor layer.

Other embodiments disclosed herein provide for a method of forming a nanoFET by forming on a substrate a multi-layer stack of alternating layers of first and second semiconductor material. The method also includes patterning the substrate and the multi-layer stack to form fins underlying respective multi-layer nano-structures. The method also includes depositing an insulator material between the respective fins, and forming a dummy gate stack extending over at least one multi-layer nano-structure. The method also includes depositing an ILD layer over the respective fins and respective multi-layer nano-structures, and removing the dummy gate stack and leaving in its place a gate recess. The method further includes, in a region of the substrate, removing the alternating layers of first semiconductor material and patterning the layers of second semiconductor material to form respective channel regions in the second semiconductor material. The method yet further includes conformally depositing a gate dielectric layer on sidewalls of the gate recess and walls of the respective channel regions. The method also includes conformally depositing an n-type work function layer on the gate dielectric layer within the gate recess and on respective walls of the respective channel regions, and conformally depositing an anti-reaction layer on the n-type work function layer in the gate recess and along walls of the respective channel regions. The method further provides for etching back upper portions of the anti-reaction layer within the gate recess and etching back upper portions of the n-type work function layer within the gate recess, such that a portion of the anti-reaction layer remains within a lower part of the gate recess and along walls of the respective channel regions, and a portion of n-type work function layer remains within the lower part of the gate recess and along walls of the respective channel regions, and depositing a second conductive layer to fill the gate recess.

Still other embodiments disclosed herein provide for a nanoFET device including a fin extending from a semiconductor substrate, and a stack of channel regions above fin, respective channel regions separated by a first layer of gate dielectric material on a lower channel region, a first layer of first conductive material on the first layer of gate dielectric material, a first layer of anti-reaction material on the first layer of first conductive material, a fill conductor interspaced between the first layer of anti-reaction material and a second layer of anti-reaction material, the second layer of anti-reaction material being on the fill conductor, a second layer of first conductive material on the second layer of anti-reaction material, and a second layer of gate dielectric material on the second layer of first conductive material. The nanoFET device also includes a gate contact formed on a topmost channel region, the gate contact including a third layer of the gate dielectric material, a third layer of the first conductive material, a third layer of the anti-reaction material, and the fill conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a nanoFET comprising:
   forming on a substrate a multi-layer stack of alternating layers of first and second semiconductor material;
   removing the alternating layers of first semiconductor material and patterning the layers of second semiconductor material to form respective channel regions in the second semiconductor material separated by respective gaps, and a recess formed above a topmost channel region of the respective channel regions; and
   forming a gate structure in the respective gaps and between the respective channel regions, by:
      conformally depositing a gate dielectric layer on respective channel regions, and in the recess,
      conformally depositing a first work function layer on the gate dielectric layer,
      conformally depositing an anti-reaction layer on the first work function layer;
   etching back upper portions of the anti-reaction layer and etching back upper portions of the first work function layer, such that a portion of the anti-reaction layer remains within lower part of the respective gaps and along walls of the respective channel regions, and a portion of first work function layer remains within the lower parts of the respective gaps and along walls of the respective channel regions; and
   depositing a fill conductive layer to fill the respective gaps.

2. The method of claim 1, further comprising patterning the multi-layer stack of alternating first and second semiconductor material into a plurality of fins.

3. The method of claim 2, further comprising:
   forming a dummy gate extending over at least one fin of the plurality of fins;
   depositing a dielectric layer around the dummy gate; and
   removing the dummy gate to form a recess for the gate structure.

4. The method of claim 3, wherein the step of forming a gate structure, includes:
   forming on the anti-reaction layer a mask layer having a topmost surface below a top level of the recess; and
   etching back the anti-reaction layer and the first work function layer to the topmost surface of the mask layer; and
   removing the mask layer.

5. The method of claim 2, further comprising:
   etching back sidewalls of the alternating layers of first semiconductor material; and
   forming a liner layer on the etched back sidewalls of the alternating layers of first semiconductor material.

6. The method of claim 1, wherein the step of forming a gate structure, includes:
   etching back the anti-reaction layer and the first work function layer from sidewalls of the recess, while leaving the anti-reaction layer and the first work function layer on the bottom of the recess.

7. The method of claim 1, wherein the step of removing the alternating layers of first semiconductor material and patterning the layers of second semiconductor material also forms respective second channel regions in the second semiconductor material separated by respective second gaps, and a second recess formed above a topmost channel region of the respective second channel regions, and further including:
   forming a second gate structure in the respective second gaps and between the respective second channel regions, by:
      conformally depositing a second gate dielectric layer on respective second channel regions, and in the second recess, depositing a second conductor layer on the second gate dielectric layer.

8. The method of claim 1, further comprising:
forming a fill layer on the anti-reaction layer; and
etching back the first work function layer, the anti-reaction layer, and the fill layer, so that a respective topmost surface of the first work function layer, the anti-reaction layer, and the fill layer is below a topmost surface of the gate dielectric layer.

9. The method of claim 1, further comprising:
lining sidewalls of the recess with a dielectric liner before the step of conformally depositing the gate dielectric layer in the recess.

10. A method of forming a nanoFET comprising:
forming on a substrate a multi-layer stack of alternating layers of first and second semiconductor material;
patterning the substrate and the multi-layer stack to form fins underlying respective multi-layer nano-structures;
depositing an insulator material between the respective fins;
forming a dummy gate stack extending over at least one multi-layer nano-structure;
depositing an ILD layer over the respective fins and respective multi-layer nano-structures;
removing the dummy gate stack and leaving in its place a gate recess;
in a region of the substrate, removing the alternating layers of first semiconductor material and patterning the layers of second semiconductor material to form respective channel regions in the second semiconductor material;
conformally depositing a gate dielectric layer on sidewalls of the gate recess and walls of the respective channel regions;
conformally depositing an n-type work function layer on the gate dielectric layer within the gate recess and on respective walls of the respective channel regions;
conformally depositing an anti-reaction layer on the n-type work function layer in the gate recess and along walls of the respective channel regions;
etching back upper portions of the anti-reaction layer within the gate recess and etching back upper portions of the n-type work function layer within the gate recess, such that a portion of the anti-reaction layer remains within a lower part of the gate recess and along walls of the respective channel regions, and a portion of n-type work function layer remains within the lower part of the gate recess and along walls of the respective channel regions; and
depositing a second conductive layer to fill the gate recess.

11. The method of claim 10, further comprising:
in a second region of the substrate:
removing the dummy gate stack and leaving in its place a second gate recess,
removing the alternating layers of first semiconductor material and patterning the layers of second semiconductor material to form respective second channel regions in the second semiconductor material,
conformally depositing a second gate dielectric layer on sidewalls of the second gate recess and walls of the respective second channel regions;
conformally depositing a p-type work function layer on the second gate dielectric layer lining the gate recess and on respective walls of the respective second channel regions; and
depositing a conductive fill layer to fill the gate recess.

12. The method of claim 10, further comprising forming a protective liner along sidewalls of the alternating layers of first semiconductor material prior to the step of removing the alternating layers of first semiconductor material, where the protective liner remains after the step of removing the alternating layers of first semiconductor material.

13. The method of claim 12, wherein the protective liner has a concave shape when viewed in cross-section.

14. The method of claim 12, wherein the step of conformally depositing a gate dielectric layer on sidewalls of the gate recess and walls of the respective channel regions includes depositing the gate dielectric layer on sidewalls of the liner.

15. The method of claim 12, further comprising:
epitaxially growing a source/drain region from fin; and
wherein the liner insulates the source/drain region from a gate structure formed between respective channel regions.

16. The method of claim 10, further comprising:
lining sidewalls of the gate recess with at least one spacer before the step of conformally depositing the gate dielectric layer.

17. The method of claim 16, further comprising:
lowering an upper surface of the second conductive layer to below a topmost surface of the at least one spacer.

18. A nanoFET device comprising:
a fin extending from a semiconductor substrate;
a stack of channel regions above the fin, respective channel regions separated by a first layer of gate dielectric material on a lower channel region, a first layer of first conductive material on the first layer of gate dielectric material, a first layer of anti-reaction material on the first layer of first conductive material, a fill conductor interspaced between the first layer of anti-reaction material and a second layer of anti-reaction material, the second layer of anti-reaction material being on the fill conductor, a second layer of first conductive material on the second layer of anti-reaction material, and a second layer of gate dielectric material on the second layer of first conductive material;
a gate structure over the stack of channel regions, the gate structure including
a u-shaped layer of the gate dielectric material, the u-shaped layer extending a first height above the fin;
an n-type work function layer over the gate dielectric material, the n-type work function layer extending a second height, less than the first height, above the fin;
an anti-reaction layer over the n-type work function layer, the anti-reaction layer comprising a dielectric material and extending the second height above the substrate;
a p-type work function layer over the anti-reaction layer, the p-type work function layer extending a third height above the fin, the third height being greater than the second height; and
a conductive cap layer over the p-type work function layer; and
a gate contact formed on the gate structure.

19. The nanoFET device of claim 18, wherein a topmost surface of the fill conductor is below a topmost surface of the first conductive material and below a topmost surface of the anti-reaction material.

20. The nanoFET device of claim 18, wherein the first layer of gate dielectric material, the first layer of first conductive material, the first layer of anti-reaction material, and the fill conductor form an arrangement of nested rectangles between respective channel regions when viewed in cross-sectional perspective.

\* \* \* \* \*